(12) United States Patent
Ohkawa et al.

(10) Patent No.: US 9,390,813 B2
(45) Date of Patent: Jul. 12, 2016

(54) SHIFT REGISTER INCLUDING UNIT CIRCUITS CONNECTED IN MULTISTAGE MANNER, AND DISPLAY DEVICE

(75) Inventors: Hiroyuki Ohkawa, Osaka (JP); Yasushi Sasaki, Osaka (JP); Yuhichiroh Murakami, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 455 days.

(21) Appl. No.: 13/818,462

(22) PCT Filed: Aug. 30, 2011

(86) PCT No.: PCT/JP2011/069635
§ 371 (c)(1),
(2), (4) Date: Feb. 22, 2013

(87) PCT Pub. No.: WO2012/029799
PCT Pub. Date: Mar. 8, 2012

(65) Prior Publication Data
US 2013/0155044 A1    Jun. 20, 2013

(30) Foreign Application Priority Data

Sep. 2, 2010 (JP) ................................. 2010-197199

(51) Int. Cl.
*G06F 3/038* (2013.01)
*G11C 19/28* (2006.01)
*G09G 3/36* (2006.01)

(52) U.S. Cl.
CPC .............. *G11C 19/28* (2013.01); *G09G 3/3677* (2013.01); *G09G 2310/0286* (2013.01)

(58) Field of Classification Search
CPC ................... G09G 3/3677; G09G 2310/0286; G11C 19/28
USPC .............................................. 345/211; 377/64
See application file for complete search history.

(56) References Cited

U.S. PATENT DOCUMENTS

2010/0141641 A1   6/2010 Furuta et al.
2010/0141642 A1*  6/2010 Furuta et al. .................. 345/213
2010/0259525 A1  10/2010 Ohkawa et al.

FOREIGN PATENT DOCUMENTS

WO       2009/034749 A1    3/2009
WO       2009/084267 A1    7/2009
WO    WO 2009084267 A1 *   7/2009

OTHER PUBLICATIONS

Official Communication issued in International Patent Application No. PCT/JP2011/069635, mailed on Dec. 6, 2011.

*Primary Examiner* — Jonathan Blancha
(74) *Attorney, Agent, or Firm* — Keating & Bennett, LLP

(57) ABSTRACT

A unit circuit (11) includes: a transistor (T2) having its drain terminal to be supplied with a clock signal (CK) and its source terminal connected to an output terminal (OUT); a transistor (T9) which, when supplied with an active all-on control signal (AON), outputs an ON voltage to the output terminal (OUT), and which, when supplied with a nonactive all-on control signal (AONB), stops outputting the ON voltage; a transistor (T1) which supplies the ON voltage to a control terminal of the transistor (T2) in accordance with an input signal (IN); a transistor (T4) which, when supplied with the active all-on control signal (AON), supplies an OFF voltage to a control terminal of the transistor (T2). This makes it possible to provide a shift register of a simple structure that can prevent a malfunction from occurring after all-on operation, and to provide a display device.

15 Claims, 36 Drawing Sheets

FIG. 4

| | t0 | t1 | t2 | t3 | t4 | t5 | tn-1 | tn | tn+1 |
|---|---|---|---|---|---|---|---|---|---|
| ST | H | | | | | | | | |
| CK1 | H | | | | | | | | |
| CK2 | H | | | | | | | | |
| N1 | L | | | | | | | | |
| N2 | L | | | | | | | | |
| OUT1 | H | | | | | | | | |
| N1 | L | | | | | | | | |
| N2 | L | | | | | | | | |
| OUT2 | H | | | | | | | | |
| N1 | L | | | | | | | | |
| N2 | L | | | | | | | | |
| OUTn | H | | | | | | | | |

FIG. 6

|       | t0 | t1 | t2 | t3 | t4 | t5 | tn-1 | tn | tn+1 |
|-------|----|----|----|----|----|----|------|----|------|
| ST    | H  |    |    |    |    |    |      |    |      |
| CK1   | H  |    |    |    |    |    |      |    |      |
| CK2   | H  |    |    |    |    |    |      |    |      |
| N1    | L  |    |    |    |    |    |      |    |      |
| N2    | L  |    |    |    |    |    |      |    |      |
| OUT1  | H  |    |    |    |    |    |      |    |      |
| N1    | L  |    |    |    |    |    |      |    |      |
| N2    | L  |    |    |    |    |    |      |    |      |
| OUT2  | H  |    |    |    |    |    |      |    |      |
| N1    | L  |    |    |    |    |    |      |    |      |
| N2    | L  |    |    |    |    |    |      |    |      |
| OUTn  | H  |    |    |    |    |    |      |    |      |

FIG. 7

|      | t0 | t1 | t2 | t3 | t4 | t5 | tn-1 | tn | tn+1 |
|------|----|----|----|----|----|----|------|----|------|
| ST   | H  |    |    |    |    |    |      |    |      |
| CK1  | L  |    |    |    |    |    |      |    |      |
| CK2  | L  |    |    |    |    |    |      |    |      |
| N1   | L  |    |    |    |    |    |      |    |      |
| N2   | L  |    |    |    |    |    |      |    |      |
| OUT1 | H  |    |    |    |    |    |      |    |      |
| N1   | L  |    |    |    |    |    |      |    |      |
| N2   | L  |    |    |    |    |    |      |    |      |
| OUT2 | H  |    |    |    |    |    |      |    |      |
| N1   | L  |    |    |    |    |    |      |    |      |
| N2   | L  |    |    |    |    |    |      |    |      |
| OUTn | H  |    |    |    |    |    |      |    |      |

FIG. 11

| | t0 | t1 | t2 | t3 | t4 | t5 | tn-1 | tn | tn+1 |
|---|---|---|---|---|---|---|---|---|---|
| ST | H | | | | | | | | |
| CK1 | H | | | | | | | | |
| CK2 | H | | | | | | | | |
| N1 | L | | | | | | | | |
| N2 | L | | | | | | | | |
| OUT1 | H | | | | | | | | |
| N1 | L | | | | | | | | |
| N2 | L | | | | | | | | |
| OUT2 | H | | | | | | | | |
| N1 | L | | | | | | | | |
| N2 | L | | | | | | | | |
| OUTn | H | | | | | | | | |

FIG. 13

|      | t0 | t1 | t2 | t3 | t4 | t5 | tn-1 | tn | tn+1 |
|------|----|----|----|----|----|----|------|-----|------|
| ST   | H  |    |    |    |    |    |      |     |      |
| CK1  | H  |    |    |    |    |    |      |     |      |
| CK2  | H  |    |    |    |    |    |      |     |      |
| N1   | L  |    |    |    |    |    |      |     |      |
| N2   | L  |    |    |    |    |    |      |     |      |
| OUT1 | H  |    |    |    |    |    |      |     |      |
| N1   | L  |    |    |    |    |    |      |     |      |
| N2   | L  |    |    |    |    |    |      |     |      |
| OUT2 | H  |    |    |    |    |    |      |     |      |
| N1   | L  |    |    |    |    |    |      |     |      |
| N2   | L  |    |    |    |    |    |      |     |      |
| OUTn | H  |    |    |    |    |    |      |     |      |

FIG. 17

|      | t0 | t1 | t2 | t3 | t4 | t5 | tn-1 | tn | tn+1 |
|------|----|----|----|----|----|----|------|----|----|
| ST   | H  |    |    |    |    |    |      |    |    |
| CK1  | H  |    |    |    |    |    |      |    |    |
| CK2  | H  |    |    |    |    |    |      |    |    |
| N1   | L  |    |    |    |    |    |      |    |    |
| N2   | L  |    |    |    |    |    |      |    |    |
| OUT1 | H  |    |    |    |    |    |      |    |    |
| N1   | L  |    |    |    |    |    |      |    |    |
| N2   | L  |    |    |    |    |    |      |    |    |
| OUT2 | H  |    |    |    |    |    |      |    |    |
| N1   | L  |    |    |    |    |    |      |    |    |
| N2   | L  |    |    |    |    |    |      |    |    |
| OUTn | H  |    |    |    |    |    |      |    |    |

FIG. 19

| | t0 | t1 | t2 | t3 | t4 | t5 | tn-1 | tn | tn+1 |
|---|---|---|---|---|---|---|---|---|---|
| ST | H | | | | | | | | |
| CK1 | H | | | | | | | | |
| CK2 | H | | | | | | | | |
| N1 | L | | | | | | | | |
| N2 | L | | | | | | | | |
| OUT1 | H | | | | | | | | |
| N1 | L | | | | | | | | |
| N2 | L | | | | | | | | |
| OUT2 | H | | | | | | | | |
| N1 | L | | | | | | | | |
| N2 | L | | | | | | | | |
| OUTn | H | | | | | | | | |

FIG. 21

| | t0 | t1 | t2 | t3 | t4 | t5 | | tn-1 | tn | tn+1 |
|---|---|---|---|---|---|---|---|---|---|---|
| ST | H | | | | | | | | | |
| CK1 | L | | | | | | | | | |
| CK2 | L | | | | | | | | | |
| N1 | L | | | | | | | | | |
| N2 | L | | | | | | | | | |
| OUT1 | H | | | | | | | | | |
| N1 | L | | | | | | | | | |
| N2 | L | | | | | | | | | |
| OUT2 | H | | | | | | | | | |
| N1 | L | | | | | | | | | |
| N2 | L | | | | | | | | | |
| OUTn | H | | | | | | | | | |

FIG. 23

|      | t0 | t1 | t2 | t3 | t4 | t5 | tn-1 | tn | tn+1 |
|------|----|----|----|----|----|----|------|----|------|
| ST   | H  |    |    |    |    |    |      |    |      |
| CK1  | H  |    |    |    |    |    |      |    |      |
| CK2  | H  |    |    |    |    |    |      |    |      |
| N1   | L  |    |    |    |    |    |      |    |      |
| N2   | L  |    |    |    |    |    |      |    |      |
| OUT1 | H  |    |    |    |    |    |      |    |      |
| N1   | L  |    |    |    |    |    |      |    |      |
| N2   | L  |    |    |    |    |    |      |    |      |
| OUT2 | H  |    |    |    |    |    |      |    |      |
| N1   | L  |    |    |    |    |    |      |    |      |
| N2   | L  |    |    |    |    |    |      |    |      |
| OUTn | H  |    |    |    |    |    |      |    |      |

FIG. 25

| | t0 | t1 | t2 | t3 | t4 | t5 | tn-1 | tn | tn+1 |
|---|---|---|---|---|---|---|---|---|---|
| ST | L | | | | | | | | |
| CK1 | L | | | | | | | | |
| CK2 | L | | | | | | | | |
| N1 | L | | | | | | | | |
| N2 | L | | | | | | | | |
| OUT1 | H | | | | | | | | |
| N1 | L | | | | | | | | |
| N2 | L | | | | | | | | |
| OUT2 | H | | | | | | | | |
| N1 | L | | | | | | | | |
| N2 | L | | | | | | | | |
| OUTn | H | | | | | | | | |

FIG. 27

| | t0 | t1 | t2 | t3 | t4 | t5 | | tn-1 | tn | tn+1 |
|---|---|---|---|---|---|---|---|---|---|---|
| ST | L | | | | | | | | | |
| CK1 | L | | | | | | | | | |
| CK2 | L | | | | | | | | | |
| N1 | L | | | | | | | | | |
| N2 | L | | | | | | | | | |
| OUT1 | H | | | | | | | | | |
| N1 | L | | | | | | | | | |
| N2 | L | | | | | | | | | |
| OUT2 | H | | | | | | | | | |
| N1 | L | | | | | | | | | |
| N2 | L | | | | | | | | | |
| OUTn | H | | | | | | | | | | ns
SHIFT REGISTER INCLUDING UNIT CIRCUITS CONNECTED IN MULTISTAGE MANNER, AND DISPLAY DEVICE

TECHNICAL FIELD

The present invention relates to shift registers and display devices and, in particular, to a shift register that is used in a driving circuit of a display device.

BACKGROUND ART

An active-matrix display device displays a picture by selecting two-dimensionally arranged display elements row by row and writing a voltage to selected display elements in accordance with display data. To select display elements row by row, a shift register for sequentially shifting output signals in accordance with clock signals is used as a scanning signal line driving circuit. Alternatively, in a display device in which dot-sequential driving is carried out, a similar shift register is provided in a data signal line driving circuit.

In the case of a liquid crystal display device, a production process for forming TFTs (thin film transistors) in display elements may be used for forming a display element driving circuit integrally with display elements. In this case, it is preferable, for a reduction in production cost, that a driving circuit including a shift register be formed by transistors of the same conductivity type as those in the display elements. Further, an increase in the number of clock signals to be applied to the shift register results in an increase in area in which clock wires are laid out and an increase in power consumption. Against such a background, there has been a need for a shift register that operates in accordance with two-phase clock signals using transistors of the same conductivity type. Use of such a shift register causes a human eye to see a disturbance in a picture as generated when the power supply circuit of the liquid crystal display device has been turned on or off, with the result that the viewer experiences a feeling of discomfort.

Such a disturbance in a picture that is displayed on the screen can be alleviated by carrying out all-on operation by which when the power supply circuit has been turned on, the shift register is caused to output high-level output signals via all output terminals. A shift register capable of carrying out such all-on operation is disclosed, for example, in Patent Literature 1.

FIG. 35 is a block diagram showing a configuration of a shift register 110 of Patent Literature 1, and FIG. 36 is a circuit diagram of a unit circuit 111 contained in the shift register 110. Operation of the unit circuit 111 shown in FIG. 36 is described here. A plurality of unit circuits 111 contained in the shift register 110 each have all-on control terminals AON and AONB (negation of AON), and when the shift register 110 carries out all-on operation, each of the unit circuits 111 is supplied with all-on control signals AON and AONB from an outside source. When the all-on control signal AON is at a high level and the all-on control signal AONB is at a low level, the unit circuit 111 has its transistor T108 in an OFF state and its transistor T109 in an ON state. Assuming here that the shift register 110 is receiving a start pulse ST and clock signals CK1 and CK2 at a high level, the unit circuit 111 has its node N102 at a potential VSS and its node N101 at a potential VDD, thus outputting an output signal at the potential VDD via its output terminal OUT. Similarly, the other unit circuits simultaneously output output signals at VDD. Therefore, a shift register constituted by such unit circuits can carry out all-on operation.

CITATION LIST

Patent Literature 1

International Publication No. WO 2009/034749 (Publication Date: Mar. 19, 2009).

SUMMARY OF INVENTION

Technical Problem

However, since, in the shift register 110, the potential at the node N101 is VDD during all-on operation and the node N101 remains charged with VDD even when the shift register 110 returns to normal operation after all-on operation, the transistor T102 may sometimes be in an ON state. When the clock signal CK is brought to a high level in such a state, the unit circuit 111 may output an output signal at a high level when the shift register 110 returns to normal operation, thus causing a malfunction to occur. In order to prevent such a malfunction from occurring, it is necessary to separately carry out initialization operation, such as fixing the potential at the node N101 at VSS, after all-on operation (when the shift register 110 returns to normal operation). Doing so requires a complex circuitry.

The present invention has been made in view of the foregoing problems, and it is an object of the present invention to provide a shift register of a simple structure that can prevent a malfunction from occurring after all-on operation, and to provide a display device including such a shift register.

Solution to Problem

In order to solve the foregoing problems, a shift register of the present invention is a shift register including unit circuits connected in a multistage manner, the shift register operating in accordance with a plurality of clock signals, the unit circuits being each constituted by transistors of a same conductivity type, each of the unit circuits including: a first output control transistor having one conducting terminal to be supplied with a first clock signal and the other conducting terminal connected to an output terminal; an all-on output signal generation circuit which, when an active all-on control signal is supplied to the unit circuit, outputs an ON voltage output signal to the output terminal, and which, when a nonactive all-on control signal is supplied to the unit circuit, stops outputting the ON voltage output signal; a precharge circuit which, when the nonactive all-on control signal is supplied to the unit circuit, supplies an ON voltage to a control terminal of the first output control transistor in accordance with an input signal; and a discharge circuit which, when the active all-on control signal is supplied to the unit circuit, supplies an OFF voltage to the control terminal of the first output control transistor.

According to the foregoing configuration, when the active all-on control signal is supplied to the unit circuit (all-on operation), an OFF voltage is supplied to the first output control transistor via the control terminal of the first output control transistor. Therefore, when the shift register returns to normal operation after all-on operation, i.e., when the all-on control signal is nonactive and the input signal is at a low level, the potential at the point of connection (node N1)

between the precharge circuit and the first output control transistor is VSS, so that the first output control transistor is not in an ON state.

Therefore, there is no fear that when the shift register returns to normal operation after all-on operation, the transistor T2 (transistor 102 of FIG. 36) is brought into an ON state, so that the high-level clock signal CK is outputted, as has conventionally been the case. This makes it possible to prevent the shift register from malfunctioning. Further, the unit circuit is no more complex in circuitry than a conventional unit circuit (see FIG. 36).

In order to solve the foregoing problems, a display device of the present invention is a display device including a display panel including data signal lines and scanning signal lines, the display device including: a scanning signal line driving circuit which includes a shift register as set forth in any one of the above and which sequentially selects the scanning signal lines; a data signal line driving circuit which supplies a video signal to the data signal lines; and a power supply circuit which supplies a power supply voltage to the scanning signal line driving circuit and the data signal line driving circuit, when the power supply circuit has been turned on or off, all of the scanning signal lines being made active by supplying the active all-on control signal to the scanning signal line driving circuit.

A display device of the present invention is a display device including a display panel including data signal lines and scanning signal lines, the display device including: a scanning signal line driving circuit which includes a shift register as set forth in any one of the above and which sequentially selects the scanning signal lines; a data signal line driving circuit which supplies a video signal to the data signal lines; and a power supply circuit which supplies a power supply voltage to the scanning signal line driving circuit and the data signal line driving circuit, when the power supply circuit has been turned on or off, all of the scanning signal lines being made active by supplying an active all-on control signal to the scanning signal line driving circuit.

Advantageous Effects of Invention

As described above, a shift register of the present invention is configured such that each of the unit circuits includes: a precharge circuit which, when a nonactive all-on control signal is supplied to the unit circuit, supplies an ON voltage to the first output control transistor via a control terminal of the first output control transistor; and a discharge circuit which, when an active all-on control signal is supplied to the unit circuit, supplies an OFF voltage to the first output control transistor via the control terminal of the first output control transistor. This makes it possible to provide a shift register of a simple structure that can prevent a malfunction from occurring after all-on operation, and to provide a display device including such a shift register.

BRIEF DESCRIPTION OF DRAWINGS

FIG. 4 is a timing chart of all-on operation of the shift register of FIG. 1.

FIG. 6 is a timing chart of all-on operation of the shift register according to Embodiment 2 in a case where clock signals CK and CKB are at a high level.

FIG. 7 is a timing chart of all-on operation of the shift register according to Embodiment 2 in a case where the clock signals CK and CKB are at a low level.

FIG. 11 is a timing chart of all-on operation of the shift register shown FIG. 8.

FIG. 13 is a timing chart of all-on operation of the shift resister according to Embodiment 4.

FIG. 17 is a timing chart of all-on operation of the shift resister according to Embodiment 5.

FIG. 19 is a timing chart of all-on operation of the shift resister according to Embodiment 6.

FIG. 21 is a timing chart of all-on operation of the shift resister according to Embodiment 7.

FIG. 23 is a timing chart of all-on operation of the shift resister according to Embodiment 8.

FIG. 25 is a timing chart of all-on operation of the shift resister according to Embodiment 9.

FIG. 27 is a timing chart of all-on operation of the shift resister according to Embodiment 10.

DESCRIPTION OF EMBODIMENTS

Embodiment 1

Figure 1:
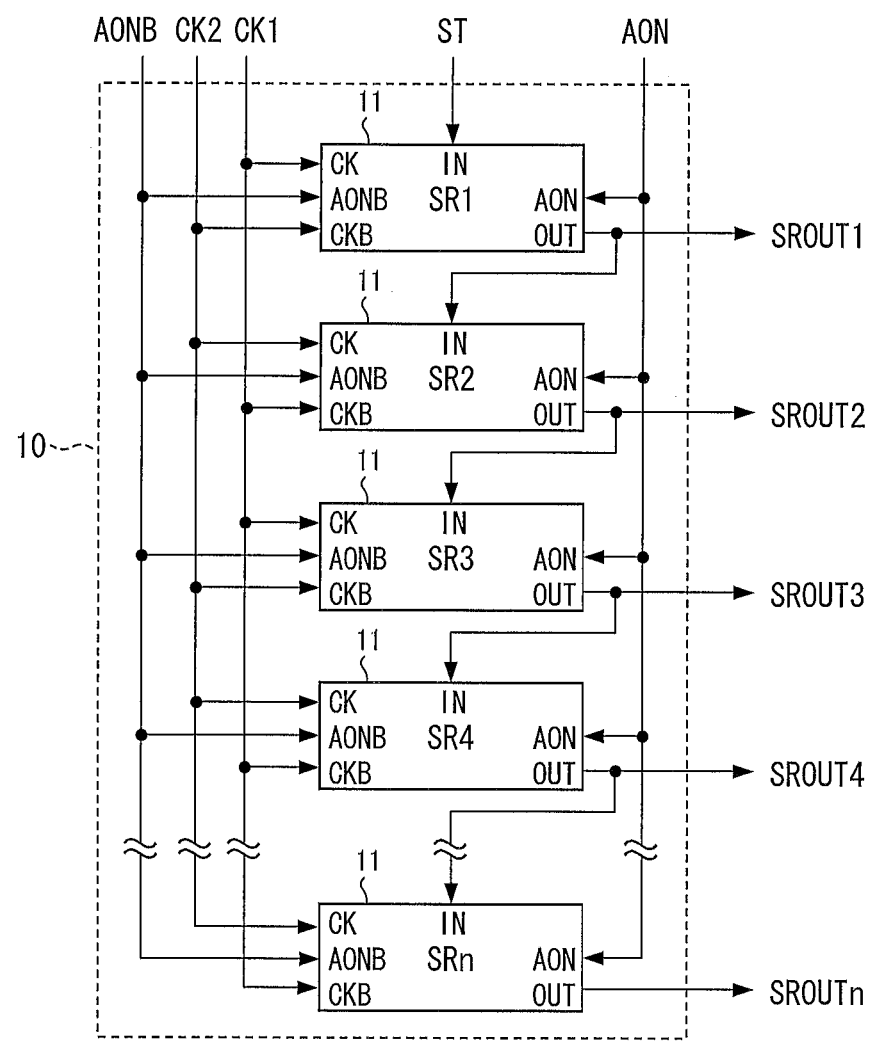
FIG. 1 is a block diagram showing a configuration of a shift register according to Embodiment 1 of the present invention.

Embodiment 1 of the present invention is described below. FIG. 1 is a block diagram showing a configuration of a shift register according to Embodiment 1. A shift register 10 shown in FIG. 1 is constituted by n (where n is an integer of 2 or more) unit circuits 11 connected in a multistage manner. Each of the unit circuits 11 has clock terminals CK and CKB, an input terminal IN, all-on control terminals AON and AONB, and an output terminal OUT. In the following, signals that are inputted and outputted via the respective terminals are given the same names as those of the corresponding terminals (for example, a signal that is inputted via the clock terminal CK is referred to as "clock signal CK").

The shift register 10 is supplied with a start pulse ST, two-phase clock signals CK (CK1) and CKB (CK2), and all-on control signals AON and AONB (negation of AON) from an outside source. The start pulse ST is supplied to the first unit circuit 11 via the input terminal IN of the first unit circuit 11. The clock signal CK1 (first clock signal) is supplied to the odd-numbered unit circuits 11 via the respective clock terminals CK of the odd-numbered unit circuits 11 and to the even-numbered (where the even numbers include 0; the same applies below) unit circuits 11 via the respective clock terminals CKB of the even-numbered unit circuits 11. The clock signal CK2 (second clock signal) is supplied to the odd-numbered unit circuits 11 via the respective clock terminals CKB of the odd-numbered unit circuits 11 and to the even-numbered unit circuits 11 via the respective clock terminals CK of the even-numbered unit circuits 11. The all-on control signal AON is supplied to the unit circuits 11 via the respective all-on control terminals AON of the unit circuits 11, and the all-on control signal AONB is supplied to the unit circuits 11 via the respective all-on control terminals AONB of the unit circuits 11. The unit circuits 11 output output signals OUT to the outside as as output signals SROUT1 to SROUTn, and each of the unit circuits 11 outputs its output signal OUT to its subsequent unit circuit 11 via the input terminal IN of the subsequent unit circuit 11.

The clock signals to be supplied to each unit circuit 11 are not limited to two-phase clock signals, and may be three- or more-phase clock signals. For example, the shift register 10 may be configured such that four-phase signals CK1, CK2, CK3, and CK4 are provided with the clock signals CK1 and CK3 in phase with each other and the clock signals CK2 and CK4 in phase with each other. This configuration can, for example, cause (i) the clock signal CK1 to be supplied to the first unit circuit 11 via the clock terminal CK of the first unit circuit 11 and to the second unit circuit 11 via the clock terminal CKB of the second unit circuit 11, (ii) the clock signal CK2 to be supplied to the first unit circuit 11 via the clock terminal CKB of the first unit circuit 11 and to the second unit circuit 11 via the clock terminal CK of the second unit circuit 11, (iii) the clock signal CK3 to be supplied to the third unit circuit 11 via the clock terminal CK of the third unit circuit 11 and to the fourth unit circuit 11 via the clock terminal CKB of the fourth unit circuit 11, (iv) the clock signal CK4 to be supplied to the third unit circuit 11 via the clock terminal CKB of the third unit circuit 11 and to the fourth unit circuit 11 via the clock terminal CK of the fourth unit circuit 11, and (v) the clock signals CK1, CK2, CK3, and CK4 to be supplied to the subsequent unit circuits 11 in the above order.

Figure 2:
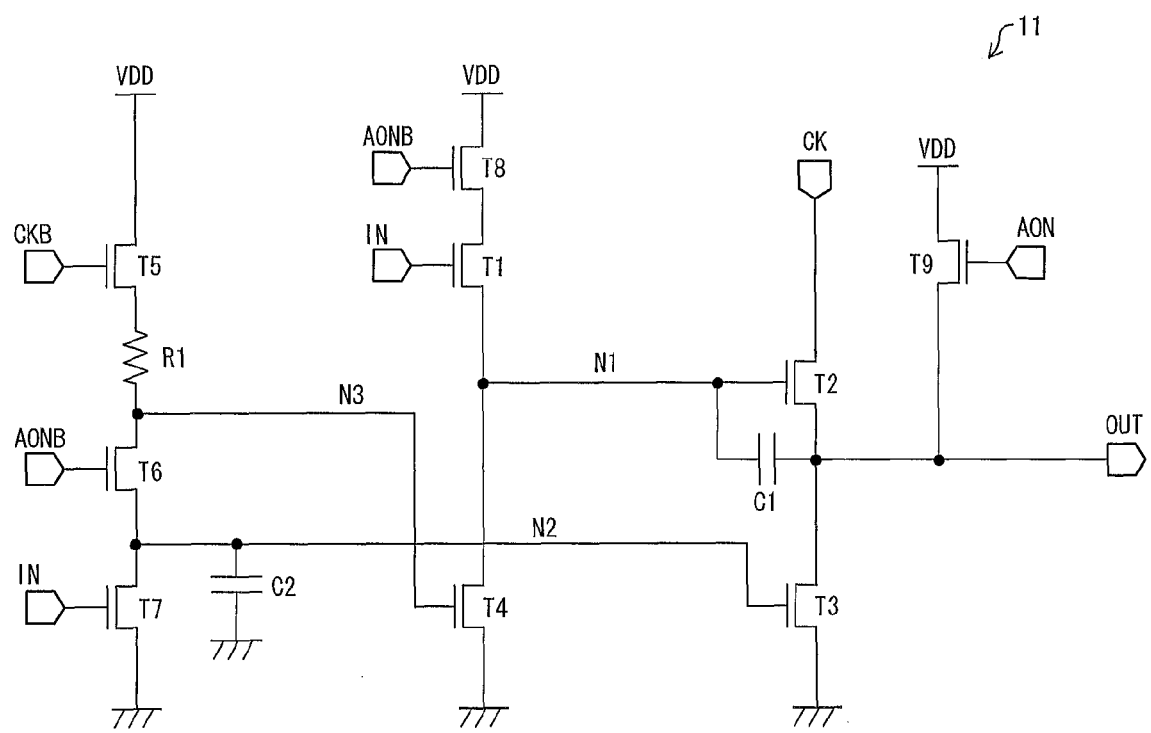
FIG. 2 is a circuit diagram of a unit circuit contained in the shift register of FIG. 1.

FIG. 2 is a circuit diagram of a unit circuit 11 contained in the shift register 10. As shown in FIG. 2, the unit circuit 11 is constituted by transistors of the same conductivity type, and includes nine N-channel transistors T1 to T9 and two capacitors C1 and C2, and a single resistor R1 (resistor element). The transistor T1 functions as a precharge circuit or a precharge transistor (second precharge transistor). The transistor T2 functions as an output control transistor (first output control transistor). The transistor T3 functions as an output control transistor (second output control transistor). The transistor T4 functions as a discharge circuit or a discharge transistor (first discharge transistor). The transistor T5 functions as a reset transistor (first reset transistor). The transistor T6 functions as a reset separation transistor. The transistor T7 functions as a reset transistor (second reset transistor). The transistor T8 functions as a precharge transistor (first precharge transistor). The transistor T9 functions as an all-on signal generation circuit. The precharge transistors T5 to T7 function as a reset signal generation circuit. In the following, the term "ON voltage (ON level)" refers to a voltage (level of a signal) which, when supplied to a transistor via the gate terminal (control terminal) of the transistor, causes the transistor to be in an ON state, and the term "OFF voltage (OFF level)" refers to a voltage (level of a signal) which, when supplied to a transistor via the gate terminal (control terminal) of the transistor, causes the transistor to be in an OFF state. In the case of an N-channel transistor, a high voltage serves as an ON voltage (a high level is an ON level), and a low voltage serves as an OFF voltage (a low level is an OFF level). In the case of a P-channel transistor, the opposite is true.

The transistor T1 has its drain terminal (one conducting terminal) connected to the source terminal of the transistor T8 and its gate terminal (control terminal) connected to the input terminal IN. Further, the transistor T1 has its source terminal (other conducting terminal) connected to the gate terminal of the transistor T2 and to the drain terminal of the transistor T4. This point of connection is hereinafter referred to as "node N1". The transistor T2 has its drain terminal connected to the clock terminal CK and its source terminal connected to the output terminal OUT and to the drain terminal of the transistor T3. The transistors T3 and T4 have their source terminals grounded.

The transistor T5 has its drain terminal to be supplied with a power supply voltage VDD, and has its source terminal connected to one end of the resistor R1. The transistor T6 has its drain terminal connected to the other end of the resistor R1, its source terminal connected to the drain terminal of the transistor T7, and its gate terminal connected to the all-on control terminal AONB. This point of connection between the resistor R1 and the transistor T6 is also connected to the gate terminal of the transistor T4. This point of connection is hereinafter referred to as "node N3". The transistor T7 has its gate terminal connected to the input terminal IN, and has its source terminal grounded. This point of connection between the transistors T6 and T7 is also connected to the gate terminal of the transistor T3. This point of connection is hereinafter referred to as "node N2".

The transistor T8 has its drain terminal to be supplied with the power supply voltage VDD, and has its source terminal connected to the drain terminal of the transistor T1 and its gate terminal connected to the all-on control terminal AONB.

The transistor T9 has its drain terminal to be supplied with the power supply voltage VDD, and has its source terminal connected to the output terminal OUT and its gate terminal connected to the all-on control terminal AON.

The capacitors C1 and C2 are constituted by capacitive elements. The capacitor C1 is provided between the gate and source terminals of the transistor T2, and the capacitor C2 is provided between the node N2 and the ground. The capacitor C1 functions as a bootstrap capacitor, and the capacitor C2 functions as a charge-retaining capacitor. It should be noted that the capacitors C1 and C2 may be constituted by wiring capacitors or parasitic capacitors instead of being constituted by capacitive elements. This simplifies the circuitry to the extent that no capacitive elements are provided.

In addition to carrying out normal operation by which high-level output signals OUT are sequentially outputted one by one at a time, the shift register 10, which includes the unit circuits 11 thus configured, carries out all-on operation by which high-level output signals OUT are simultaneously outputted to all of the output terminals. The following assumes that the potentials of signals inside the shift register 10 and of signals that are inputted to and outputted from the shift register 10 are VDD when those signals are at a high level, and VSS when those signals are at a low level, unless otherwise noted.

(Normal Operation)

Figure 3:
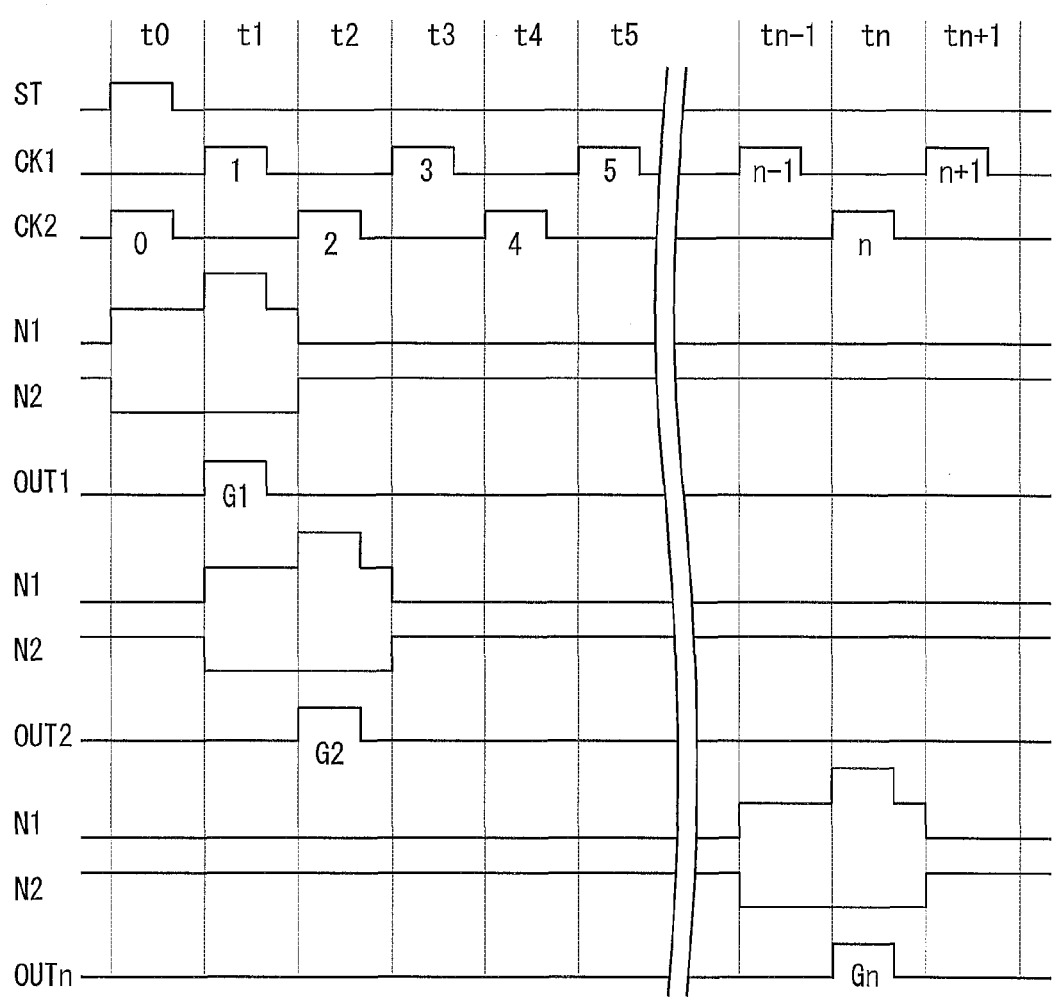
FIG. 3 is a timing chart of normal operation of the shift register of FIG. 1.

Next, normal operation is described with reference to FIG. 3. FIG. 3 is a timing chart of normal operation of the shift register 10. In FIG. 3, each of the periods t0 to tn+1 is divided into the first and second halves, and during normal operation, the all-on control signal AON is at a low level (nonactive) and the all-on control signal AONB is at a high level.

The start pulse ST is at a high level during the first half of the period t0. The clock signal CK1 is at a high level during the first half of a period tod (where od is an odd number; hereinafter referred to as "odd-numbered period), and the clock signal CK2 is at a high level during the first half of a period tev (where ev is an even number; hereinafter referred to as "even-numbered period). At other times, these three signals are at a low level. Thus, the clock signals CK1 and CK2 are set to be out of phase with each other so as not to have their high-level periods overlapped with each other.

As shown in FIG. 3, when the start pulse ST has been supplied as an input signal IN, the first unit circuit 11 (hereinafter referred to as "unit circuit SR1") operates as follows: In the unit circuit SR1, the input signal IN is at a high level during the first half of the period t0, the clock signal CK (CK1) is at a high level during the first half of an odd-numbered period, and the clock signal CKB (CK2) is at a high level during the first half of an even-numbered period.

During the first half of the period t0, where the start pulse ST is at a high level, the transistor T1 is in an ON state, so that the potential at the node N1 is VDD-Vth (where Vth is the threshold voltage of each of the transistors T1 and T8) and the transistor T2 is in an ON state. Further, when the clock signal CKB is at a high level, the transistor T5 is in an ON state. Furthermore, since the start pulse ST is at a high level, the transistor T7 is in an ON state, and since the all-on control signal AONB is at a high level during normal operation, the transistor T6 is in an ON state. If the resistor R1 has a high resistivity here, the potentials at the nodes N2 and N3 are both VSS, so that the transistors T3 and T4 are both in an OFF state. At this point in time, since the clock signal CK is at a low level and since the all-on control signals AON is at a low level (nonactive) during normal operation so that the transistor T9 is in an OFF state, the output signal OUT is at a low level. In the capacitor C1, a charge corresponding to the potential difference VDD-Vth between the gate and source of the transistor T2 is stored.

During the second half of the period t0, since the start pule ST and the clock signal CKB are at a low level, the transistors T1, T5, and T7 are in an OFF state. When the transistor T1 is brought into an OFF state, the node N1 is brought into a floating state, but the potential at the node N1 is retained at VDD-Vth by the capacitor C1.

During the first half of the period t1, the clock signal CK is at a high level. At this point in time, the transistor T2 is in an ON state, so that the output signal OUT is at a high level. Further, the node N1 is in a floating state, and the node N1 and the source terminal of the transistor T2 are connected to each other via the capacitor C1 retaining the potential difference VDD-Vth. When the potential at the source terminal of the transistor T2 changes from VSS to VDD, the potential at the node N1 changes by the same amount, and becomes higher than the power supply voltage VDD (bootstrap effect). Therefore, the clock signal CK, whose maximum voltage is VDD, passes through the transistor T2 without a voltage drop, and is outputted via the output terminal OUT with the voltage level maintained.

During the second half of the period t1, the clock signal CK is at a low level. At this point in time, the transistor T2 is in an ON state, so that the output signal OUT is at a low level and the potential at the node N1 returns to VDD-Vth.

During the first half of the period t2, since the clock signal CKB is at a high level, the transistor T5 is in an ON state, so that the potentials at the nodes N2 and N3 rise. In the result, the transistors T3 and T4 are brought into an ON state, so that the potentials at the node N1 and the output terminal OUT become VSS. It should be noted that at this point in time, the potential at the node N2 becomes VDD-Vth, so that a charge corresponding to the power supply voltage VDD is stored in the capacitor C2.

At and after this point in time, the unit circuit SR1 operates as follows: During the first half of an odd-numbered period, the clock signal CK is at a high level and the clock signal CKB is at a low level, so that the transistor T5 is in an OFF state. Therefore, the potential at the node N2 is retained at the VDD-Vth by the capacitor C2. Meanwhile, during the first half of an even-numbered period, the clock signal CK is at a low level and the clock signal CKB is at a high level, so that the transistor T5 is in an ON state. Therefore, the potential at the node N2 is VDD-Vth, so that a charge corresponding to the power supply voltage VDD is stored in the capacitor C2.

As a result of this, as shown in FIG. 3, the potential at the node N1 in the unit circuit SR1 is VDD-Vth during the period t0 and the second half of the period t1, is at a higher level than VDD during the first half of the period t1, and is VSS during the other periods. The potential at the node N2 in the unit circuit SR1 is VSS during the periods t0 and t1, and is VDD-Vth during and after the period t2. Further, the output signal OUT from the unit circuit SR1 (output signal SROUT1 from the shift register 10) is at a high level during the first half of the period t1, and is at a low level during the other periods.

Similarly, the output signal OUTi from the ith (where i is an integer of 1 or more) (output signal SROUT1 from the shift register 10) is at a high level during the first half of the period ti, and is at a low level during the other periods. Such a shift register 10 sequentially brings the output signals SROUT1 to SROUTn to a high level one by one at a time in accordance with the two-phase clock signals CK1 and CK2.

(All-on Operation)

Next, all-on operation is described with reference to FIG. 4. FIG. 4 is a timing chart of all-on operation of the shift register 10. During all-on operation, the all-on control signal AON is at a high level (active), and the all-on control signal AONB is at a low level. Further, the start pulse ST and the clock signals CK and CKB are each set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistor T3 is brought into an OFF state. Further, since the clock signal CKB is at a high level, the transistor T5 is in an ON state and the potential at the node N3 is VDD-Vth, so that the transistor T4 is in an ON state.

Further, since the all-on control signal AONB is at a low level, the transistor T8 is in an OFF state. This causes the potential at the node T1 to be VSS, so that the transistor T2 is brought into an OFF state. At this point in time, since the all-on control signal AON is at a high level, the transistor T9 is in an ON state, so that an output signal OUT at a level of VDD-Vth (where Vth is the threshold voltage of the transistor T9) is outputted via the output terminal OUT. This output signal OUT is outputted to the outside as the output signal SROUT1, and is supplied to the subsequent unit circuit 11 via its input terminal IN. The subsequent unit circuit 11 carries out the same operation as the first unit circuit 11.

Thus, during all-on operation, output signals OUT at a high level of VDD-Vth are outputted via all of the output terminals OUT1 to OUTn over the periods t0 to tn+1.

Figure 36:
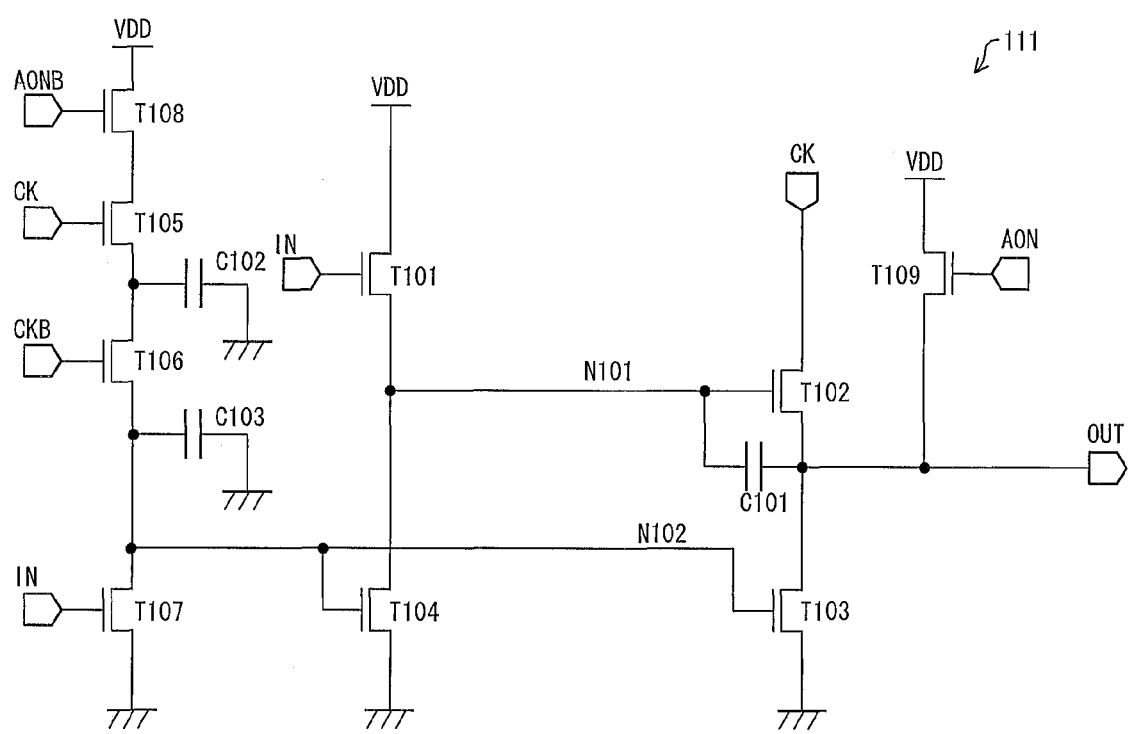
FIG. 36 is a timing chart of all-on operation of the shift register shown in FIG. 35.

During all-on operation of the shift register 10 according to Embodiment 1, since the clock signal CKB is at a high level and the all-on control signal AONB is at a low level, the transistors T4 and T5 are in an ON state and the transistor T6 is in an OFF state, so that the potential at the node N1 is fixed at VSS. Therefore, there is no fear that when the shift register 10 returns to normal operation after all-on operation, the transistor T2 is brought into an ON state, so that the clock signal CK is outputted, as has conventionally been the case. This makes it possible to prevent the shift register 10 from malfunctioning. Further, as shown in FIG. 2, the unit circuit 11 according to Embodiment 1 is no more complex in circuitry than a conventional unit circuit (see FIG. 36).

Furthermore, the unit circuit 11 of the shift register 10 according to Embodiment 1 is provided with the transistor T8, which is in an OFF state during all-on operation. Therefore, even when the transistors T1 and T4 are in an ON state during all-on operation, no through current passes through the transistors T1 and T4. This makes it possible to stabilize operation of the shift register 10.

It should be noted that the unit circuit 11 of FIG. 2 may be configured such that no transistor T8 is provided. In this case, in order to prevent a malfunction by suppressing a through current flowing through the transistors T1 and T4, i.e., in order that the potential at the node N1 is VSS, it is preferable that the capacity (size) of the transistor T4 be larger than the capacity (size) of the transistor T1. The same applies to each of the unit circuits described below.

Further, the unit circuit 11 of FIG. 2 may be configured such that no resistor R1 is provided or such that the relationship of connection between the resistor R1 and the transistor T5 is reversed. For example, the above operation can be achieved by a configuration in which a parasitic capacitor corresponding to the resistor R1 is utilized without providing a resistor element or by a configuration in which the size of the transistor T5 is adjusted without providing a resistor element. The same applies to each of the unit circuits described below.

In the following, shift registers according to other embodiments of the present invention are described. The following description mainly discusses differences between the shift register 10 according to Embodiment 1 and the shift registers according to the other embodiments. Components having the same functions as those described in Embodiment 1 are given the same reference signs and, as such, are not described below.

Embodiment 2

Figure 5:
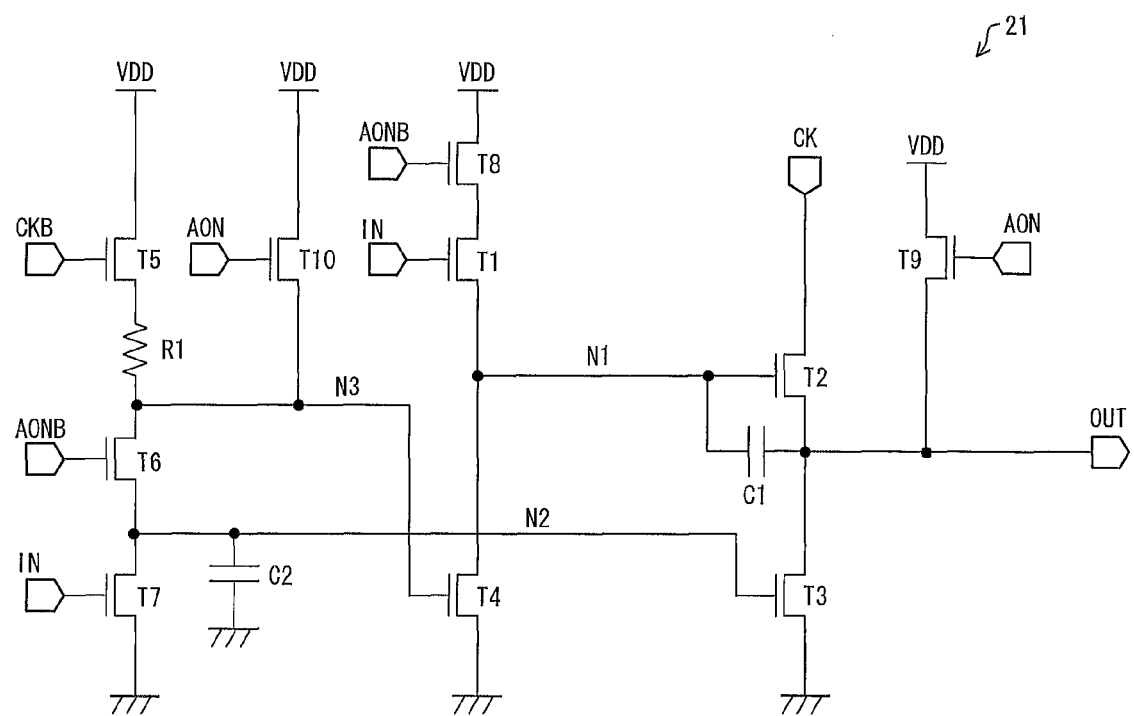
FIG. 5 is a circuit diagram of a unit circuit contained in a shift register according to Embodiment 2 of the present invention.

Embodiment 2 of the present invention is described below. A shift register 20 according to Embodiment 2 (not illustrated) is configured in the same manner as the shift register 10 according to Embodiment 1 as shown in FIG. 1. FIG. 5 is a circuit diagram of a unit circuit 21 contained in the shift register 20. The unit circuit 21 shown in FIG. 5 is a circuit obtained by incorporating a transistor T10 into a unit circuit 11 (see FIG. 2) contained in the shift register 10 according to Embodiment 1. The transistor T10 functions as a reset transistor (second reset transistor).

As shown in FIG. 5, the transistor T10 has its drain terminal to be supplied with the power supply voltage VDD, its source terminal connected to the node N3, and its gate terminal connected to the all-ON control terminal AON.

Since normal operation of the shift register 20 is identical to the normal operation of the shift register 10, the following description discusses all-on operation. During all-on operation, the all-on control signal AON is at a high level (active), and the all-on control signal AONB is at a low level. Further, the start pulse ST is set at a high level. The clock signals CK and CKB can be set at any level. First, a case where the clock signals CK and CKB are set at a high level is described. FIG. 6 is a timing chart of all-on operation of the shift register 20 in a case where the clock signals CK and CKB are at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistor T3 is brought into an OFF state. Further, since the all-on control signal AON is at a high level, the transistor T10 is in an ON state and the potential at the node N3 is VDD-Vth (where Vth is the threshold voltage of the transistor T10), so that the transistor T4 is in an ON state. Further, since the all-on control signal AONB is at a low level, the transistor T8 is in an OFF state. This causes the potential at the node N1 to be VSS, so that the transistor T2 is brought into an OFF state. Moreover, since the transistor T9 is in an ON state, an output signal OUT at a potential level of VDD-Vth (where Vth is the threshold value of the transistor T10) is outputted via the output terminal OUT. The output signal OUT is outputted to the outside as the output signal SROUT1, and is supplied to the subsequent unit circuit 21 via its input terminal IN. The subsequent unit circuit 21 carries out the same operation as the first unit circuit 21.

Thus, during all-on operation, output signals OUT at a high level of VDD-Vth are outputted via all of the output terminals OUT1 to OUTn over the periods t0 to tn+1.

Next, a case in which the clock signals CK and CKB are at a low level is described. FIG. 7 is a timing chart of all-on operation of the shift register 20 in a case where the clock signals CK and CKB are at a low level.

Since the start pulse ST is at a high level, the transistor T7 is in an ON state. This causes the potential at the node N2 to be VSS, so that the transistor T3 is brought into an OFF state. Further, since the all-on control signal AON is at a high level even if the clock signal CKB is at the low level, the transistor T10 is in an ON state. This causes the potential at the node N3 to be VDD-Vth (where Vth is the threshold voltage of the transistor T10). As a result, the transistor T4 is in an ON state, so that the potential at the node N1 is VSS, and further causing the transistor T2 to be in an OFF state. As a result, the transistor T9 is brought into an ON state, so that an output signal OUT at a level of VDD-Vth (where Vth is the threshold voltage of the transistor T9) is outputted via the output terminal OUT. This output signal OUT is outputted to the outside as the output signal SROUT1, and is supplied to the subsequent unit circuit 21 via its input terminal IN. The subsequent unit circuit 21 carries out the same operations as the first unit circuit 21.

Thus, during all-on operation, even in a case where the clock signals CK and CKB are at a low level, output signals OUT at a high level of VDD-Vth are outputted via all of the output terminals OUT1 to OUTn over the periods t0 to tn+1.

The shift register 20 according to the present embodiment is provided with the transistor T10, and therefore causes the potential at the node N3 to be VDD-Vth (ON voltage) during all-on operation. As a result, the transistor T4 is brought into an ON state, and the potential of the node N1 is fixed at VSS. That is, it is possible to carry out all-on operation while fixing the potential at the node N1 at VSS, regardless of the levels of the clock signals CK and CKB.

Embodiment 3

Figure 8:
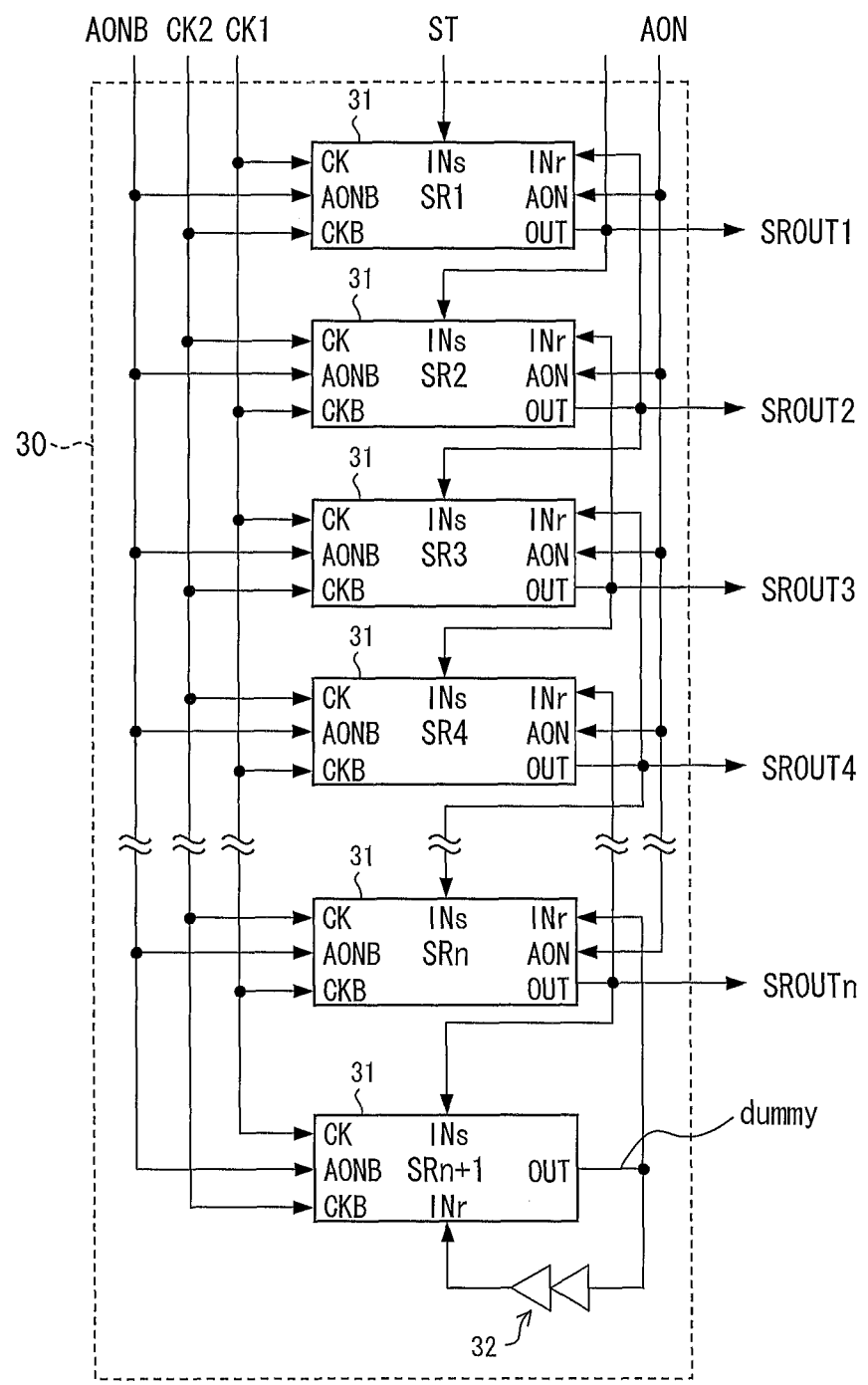
FIG. 8 is a block diagram showing a configuration of a shift register according to Embodiment 3.

Embodiment 3 of the present invention is described below. FIG. 8 is a block diagram showing a configuration of a shift register according to Embodiment 3. A shift register 30 shown in FIG. 8 is constituted (n+1) unit circuits 31 connected in multistage manner. Each of the unit circuits 31 has clock terminals CK and CKB, input terminals INs and INr, all-on control terminals AON and AONB, and an output terminal OUT.

The shift register 30 is supplied with a start pulse ST, two-phase clock signals CK and CKB, and all-on control signals AON and AONB (negation of AON) from an outside source. The start pulse ST is supplied to the first unit circuit 31 via the input terminal INs of the first unit circuit 31. The clock signal CK1 is supplied to the odd-numbered-stage unit circuits 31 via the respective clock terminals CK of the odd-numbered unit circuits 31 and to the even-numbered-stage unit circuits 31 via the respective clock terminals CKB of the even-numbered-stage unit circuits 31. The clock signal CK2 is supplied to the odd-numbered-stage unit circuits 31 via the respective clock terminals CKB of the odd-numbered-stage unit circuits 31 and to the even-numbered-stage unit circuits 31 via the respective clock terminals CK of the even-numbered-stage unit circuits 31. The all-on control signal AON is supplied to the unit circuits 31 via the respective all-on control terminals AON of the unit circuits 31, and the all-on control signal AONB is supplied to the unit circuits 31 via the respective all-on control terminals AONB of the unit circuits 31. The unit circuits 31 output output signals OUT to the outside as output signals SROUT1 to SROUTn except for the (n+1)th unit circuit 31, and each of the unit circuits 31 outputs its output signal OUT to (i) its subsequent unit circuit 31 via the input terminals INs of the subsequent unit circuit 31 and (ii) its preceding unit circuit 31 via the input terminal INr of the preceding unit circuit 31. The output signal OUT of the (n+1)th unit circuit 31 (output signal dummy) is supplied to (i) the input terminal INr of the nth unit circuit 31 and (ii) the input terminal INr of the (n+1)th unit circuit 31 via a delay circuit 32 (e.g., a buffer).

Figure 9:
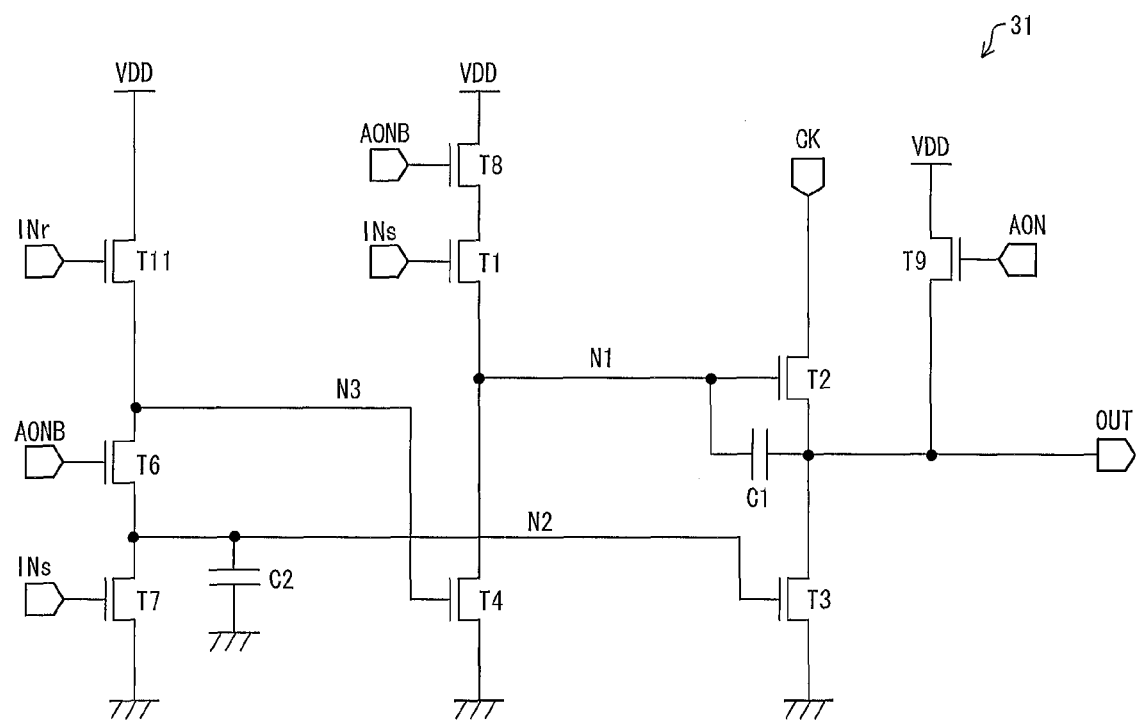
FIG. 9 is a circuit diagram of a unit circuit contained in the shift register shown FIG. 8.

FIG. 9 is a circuit diagram of the unit circuit 31 contained in the shift register 30. As shown in FIG. 9, the unit circuit 31 is constituted by transistors of the same conductivity type, and includes nine N-channel transistors T1 to T4, T6 to T9, and T11, and two capacitors C1 and C2. The transistor T11 functions as a reset transistor (third reset transistor), and the transistors T6, T7, and T11 function as a reset signal generation circuit.

The transistor T11 has its drain terminal to be supplied with the power supply voltage VDD, its source terminal connected to the drain terminal of the transistor T6, and its gate terminal connected to the input terminal INr. The transistor T6 and the transistor T11 are connected at a point of connection (node N3) to which the transistor T4 has its gate terminal connected.

The transistor T6 has its source terminal connected to the drain terminal of the transistor T7, and its gate terminal connected to the all-on control terminal AONB. The transistor T7 has its gate terminal connected to the input terminal INs and its source terminal grounded. The transistors T6 and T7 are connected at a point of connection (node N2) to which the transistor T3 has its gate terminal connected.

The shift register 30 including the unit circuits 31 configured as described above carries out an all-on operation of simultaneously outputting high-level output signals OUT to all of the output terminals OUT, as well as the normal operation of sequentially outputting high-level output signals one by one at a time, as with the shift register 10 according to Embodiment 1. Further, in the shift register 30, the output signals OUT are outputted to the outside as output signals SROUT1 to SROUTn, and are inputted via the input terminals INs of the respectively subsequent unit circuits 31 and via the input terminals INr of the respectively preceding unit circuits 31. That is, the shift register 30 carries out discharging of the node N1 and pulling down of the output signals by use of the output signals from the respectively subsequent unit circuit 31.

(Normal Operation)

Figure 10:
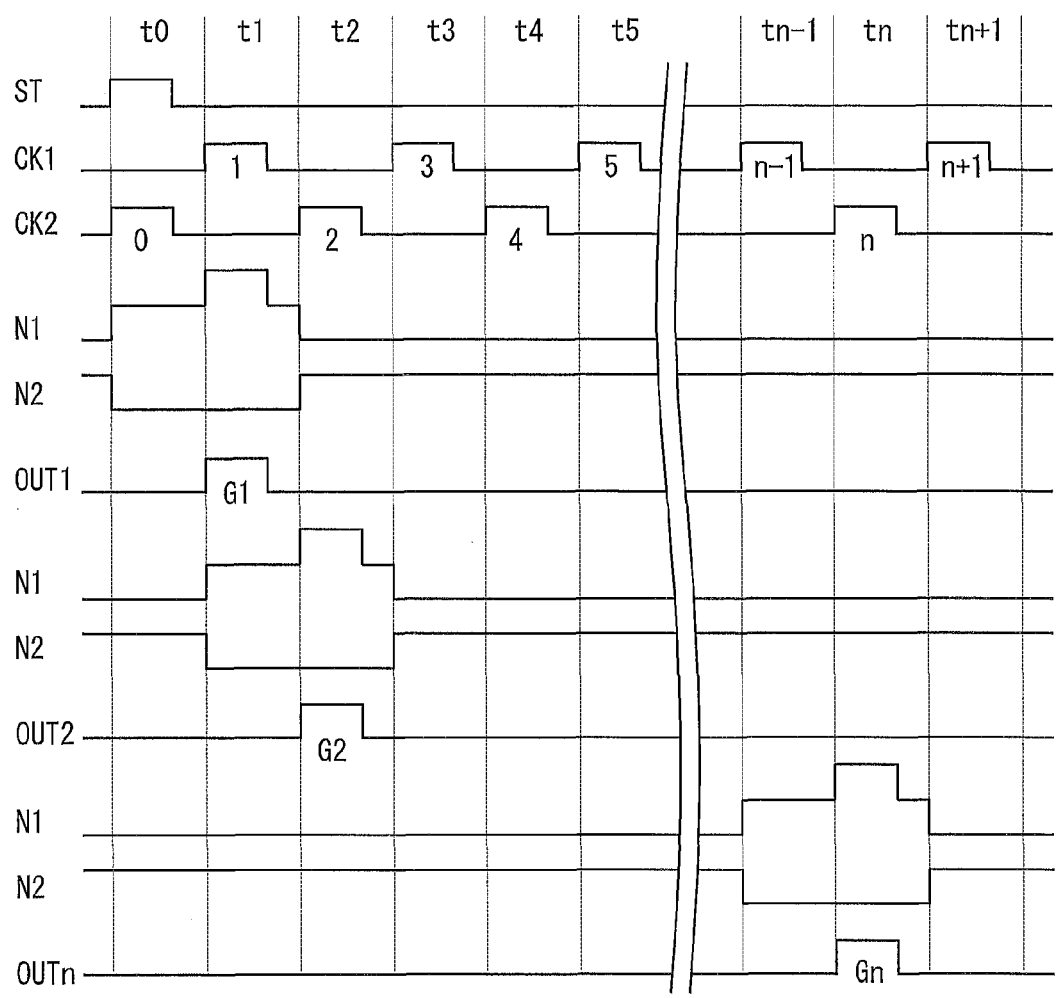
FIG. 10 is a timing chart of normal operation of the shift register shown FIG. 8.

Next, normal operation is described with reference to FIG. 10. FIG. 10 is a timing chart of normal operation of the shift register 30. In FIG. 10, each of the periods t0 to tn+1 is divided into the first and second halves, and during normal operation, the all-on control signal AON is at a low level (nonactive) and the all-on control signal AONB is at a high level.

The start pulse ST is at a high level during the first half of the period t0. The clock signal CK1 is at a high level during the first half of the period tod, and the clock signal CK2 is at a high level during the first half of the period tev. At other times, these three signals are at a low level. Thus, the clock signals CK1 and CK2 are set to be out of phase with each other so as not to have their high-level periods overlapped with each other.

As shown in FIG. 10, when the start pulse ST has been supplied as an input signal INs, the first unit circuit SR1 operates as follows: In the unit circuit SR1, the input signal INs is at a high level during the first half of the period t0, the clock signal CK is at a high level during the first half of an odd-numbered period, and the clock signal CKB is at a high level during the first half of an even-numbered period.

During the first half of the period t0, where the start pulse ST is at a high level, the transistor T1 is in an ON state, so that the potential at the node N1 is VDD-Vth (where Vth is the threshold voltage of each of the transistors T1 and T8), and the transistor T2 is in an ON state. Further, since the start pulse ST is at a high level, the transistor T7 is in an ON state, and since the all-on control signal AONB is at a high level during normal operation, the transistor T6 is in an ON state. At this point in time, since the input signal INr is at a low level during the period t0, (i) the transistor T11 is in an OFF state, (ii) the potentials at the node N2 and the node N3 are both VSS, and (iii) the transistors T3 and T4 are both in an OFF state. At this point in time, since the clock signal CK is at a low level and since the all-on control signal AON is at a low level during normal operation so that the transistor T9 is in an OFF state, the output signal OUT is at a low level. In the capacitor C1, a charge corresponding to the potential difference VDD-Vth between the gate and source of the transistor T2 is stored.

During the second half of the period t0, since the start pulse ST and the input signal INr are at a low level, the transistors T1, T7, and T11 are in an OFF state. When the transistor T1 is brought into an OFF state, the node N1 is brought into a floating state, but the potential at the node N1 is retained at VDD-Vth by the capacitor C1.

During the first half of the period t1, the clock signal CK is at a high level. At this point in time, the transistor T2 is in an ON state, so that the output signal OUT is at a high level. Further, the node N1 is in a floating state, and the node N1 and the source terminal of the transistor T2 are connected to each other via the capacitor C1 retaining the potential difference VDD-Vth. When the potential at the source terminal of the transistor T2 changes from VSS to VDD, the potential at the node N1 changes by the same amount, and becomes higher than the power-supply voltage VDD (bootstrap effect). Therefore, the clock signal CK, whose maximum voltage is VDD, passes through the transistor T2 without a voltage drop, and is outputted via the output terminal OUT with the voltage level maintained.

During the second half of the period t1, the clock signal CK is at a low level. At this point in time, the transistor T2 is in an ON state, so that the output signal OUT is at a low level and the potential at the node N1 returns to VDD-Vth.

During the first half of the period t2, since the input signal INr is at a high level, the transistor T11 is in an ON state, so that the potentials at the nodes N2 and N3 rise. In the result, the transistors T3 and T4 are brought into an ON state, so that the potentials at the node N1 and the output terminal OUT become VSS. It should be noted that at this point in time, the potential at the node N2 is VDD-Vth, so that a charge corresponding to the power supply voltage VDD is stored in the capacitor C2.

At and after this point in time, the unit circuit SR1 operates as follows: Since the input signal INr is at a low level, the transistor T11 is in an OFF state. Accordingly, the potential at the node N2 is retained at VDD-Vth by the capacitor C2.

As a result of this, as shown in FIG. 10, the potential at the node N1 in the unit circuit SR1 is VDD-Vth during the period t0 and during the second half of the period t1, is at a higher level than VDD during the first half of the period t1, and is at VSS during the other periods. The potential at the node N2 in the unit circuit SR1 is VSS during the periods t0 and t1, and is VDD during and after the period t2. Further, the output signal OUT from the unit circuit SR1 (output signal SROUT1 from the shift register 30) is at a high level during the first half of the period t1, and is at a low level during the other periods.

Similarly, the output signal OUTi from the ith unit circuit 31 (output signal SROUTi from the shift register 30) is at a high level during the first half of the period ti, and is at a low level during the other periods. Such a shift register sequentially brings the output signals SROUT1 to SROUTn to a high level one by one at a time in accordance with the two-phase clock signals CK1 and CK2, and sequentially brings the output signals SROUT1 to SROUTn to a low level one by one at a time in accordance with the respectively subsequent output signals SROUT1 to SROUTn (reset operation).

(All-on Operation)

Next, all-on operation is described with reference to FIG. 11. FIG. 11 is a timing chart of all-on operation of the shift register 30. In FIG. 11, each of the periods t0 to tn+1 is divided into the first and second halves, and during all-on operation, the all-on control signal AON is at a high level (active) and the all-on control signal AONB is at a low level. Further, the start pulse ST and the clock signals CK and CKB are each set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistor T3 is brought into an OFF state. Further, since the input signal INr is at a high level, the transistor T11 is in an ON state and the potential at the node N3 is VDD-Vth (where Vth is the threshold voltage of the transistor T11), so that the transistor T4 is in an ON state. Further, since the all-on control signal AONB is at a low level, the transistor T8 is in an OFF state. This causes the potential at the node N1 to be VSS, so that the transistor T2 is brought into an OFF state. At this point in time, since the all-on control signal AON is at a high level, the transistor T9 is in an ON state, so that an output signal OUT at a level of VDD-Vth (where Vth is the threshold value of the transistor T9) is outputted via the output terminal OUT. This output signal OUT is outputted to the outside as the output signal SROUT1, and is supplied to the subsequent unit circuit 31 via its input terminal INs. In the second and latter stages, the output signal OUT is outputted to the outside and is supplied to its corresponding subsequent unit circuit 31 via the input terminal INs of that subsequent unit circuit 31 and to its corresponding preceding unit circuit 31 via the input terminal INr of that preceding unit circuit 31.

Thus, during all-on operation, output signals OUT at a high level of VDD-Vth are outputted via all of the output terminals OUT1 to OUTn over the periods t0 to tn+1.

Embodiment 4

Figure 12:
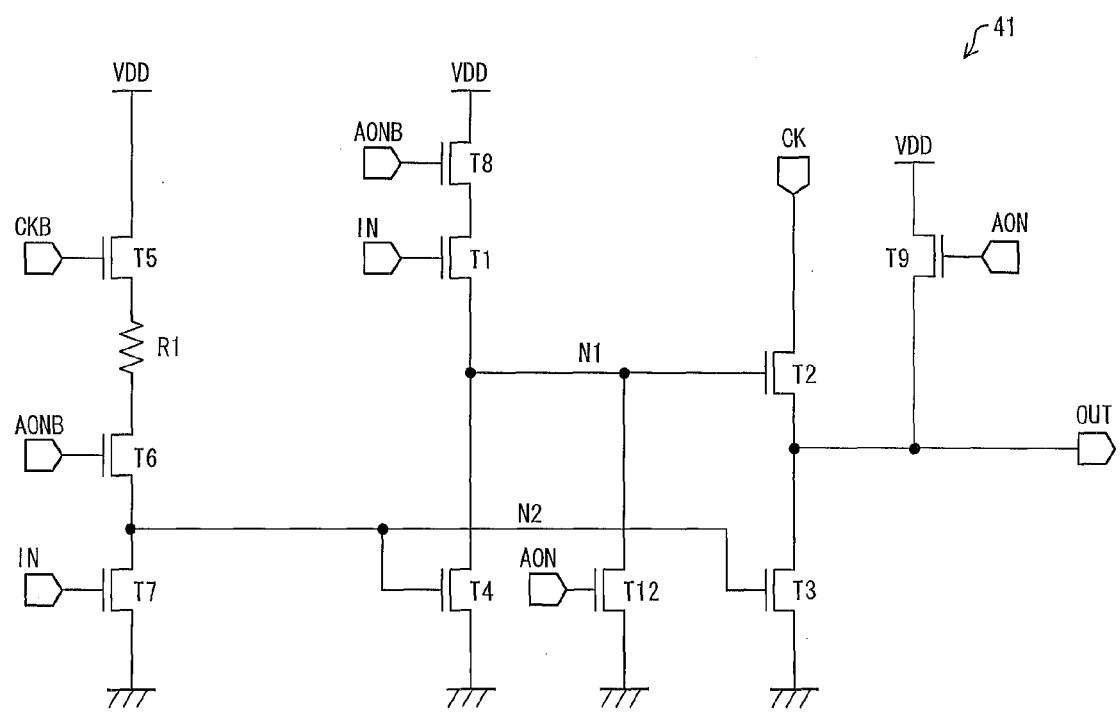
FIG. 12 is a circuit diagram of a unit circuit contained in a shift register according to Embodiment 4 of the present invention.

Embodiment 4 of the present invention is described below. A shift register 40 according to Embodiment 4 (not illustrated) is configured in the same manner as the shift register 10 according to Embodiment 1 as shown in FIG. 1. FIG. 12 is a circuit diagram of a unit circuit 41 contained in the shift register 40. The unit circuit 41 shown in FIG. 12 is a circuit obtained by incorporating a transistor T12 into a unit circuit 11 (see FIG. 2) contained in the shift register 10 according to Embodiment 1. The transistor T12 functions as a discharge transistor (second discharge transistor).

As shown in FIG. 12, the transistor T12 has its drain terminal connected to the node N1, its gate terminal connected to the all-on control terminal AON, and its source terminal grounded. Further, unlike in the unit circuit 11, the transistor T4 has its gate terminal connected to the node N2.

Since normal operations of the shift register 20 is identical to the normal operation of the shift register 10, the following description discusses all-on operation. FIG. 13 is a timing chart of all-on operation of the shift register 40. During all-on operation, the all-on control signal AON is at a high level (active), and the all-on control signal AONB is at a low level. Further, the start pulse ST and the clock signals CK and CKB are set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistors T3 and T4 are brought into an OFF state. Further, since the all-on control signal AON is at a high level, the transistors T12 and T9 are in an ON state. Further, since the all-on control signal AONB is at a low level, the transistor T8 is in an OFF state. This causes the potential at the node N1 to be VSS, so that the transistor T2 is brought into an OFF state and an output signal OUT at a level of VDD-Vth (where Vth is the threshold voltage of the transistor T9) to be outputted via the output terminal OUT. This output signal OUT is outputted to the outside as the output signal SROUT1, and is supplied to the subsequent unit circuit 41 via its input terminal IN. The subsequent unit circuit 41 carries out the same operations as the first unit circuit 41.

Thus, during all-on operation, output signals OUT at a high level of VDD-Vth are outputted via all of the output terminals OUT1 to OUTn over the periods t0 to tn+1.

Even in a case where the clock signals CK and CKB are at a low level, the transistor T6 is in an OFF state. Accordingly, the transistor T4 has its gate terminal supplied with VSS, and is therefore brought into an OFF state. At this point in time, since the all-on control signal AON is at a high level, the transistor T12 is in an ON state, so that the potential at the node N1 is VSS. As a result, the transistor T2 is in an OFF state, so that an output signal OUT at a level of VDD-Vth (where Vth is the threshold voltage of the transistor T9) is outputted via the output terminal OUT.

Thus, during all-on operation, even in a case where the clock signals CK and CKB are at a low level, output signals OUT at a high level of VDD-Vth are outputted via all of the output terminals OUT1 to OUTn over the periods t0 to tn+1.

The shift register 40 according to Embodiment 4 is provided with the transistor T12, and therefore causes the potential at the node N1 to be fixed at VSS during all-on operation. That is, it is possible to carry out all-on operation while fixing the potential at the node N1 at VSS, regardless of the levels of the clock signals CK and CKB.

Figure 14:
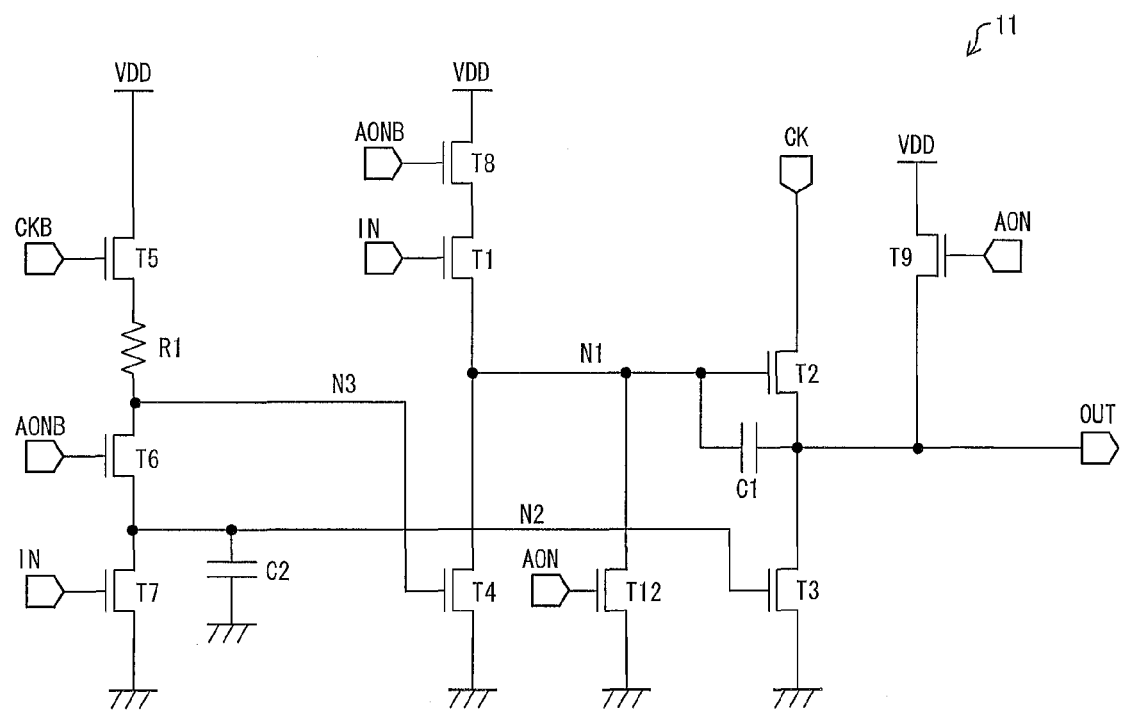
FIG. 14 is a circuit diagram showing another configuration of the unit circuit contained in the shift register according to Embodiment 1.
Figure 15:
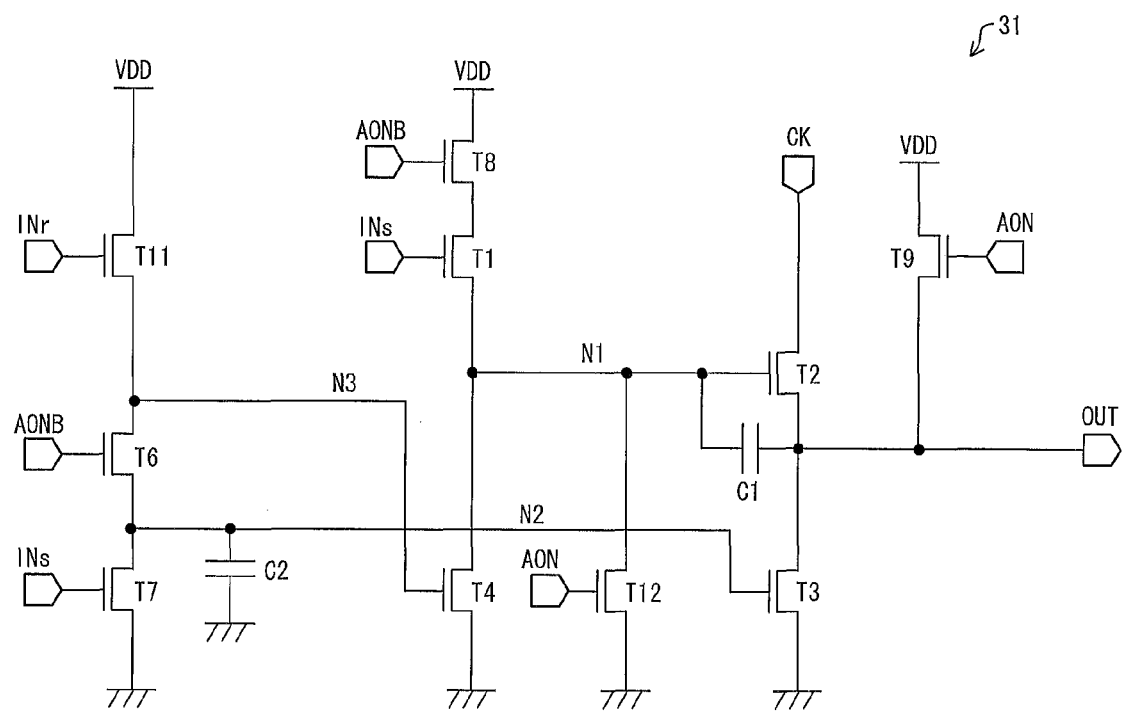
FIG. 15 is a circuit diagram showing another configuration of the unit circuit contained in the shift register according to Embodiment 3.

The transistor T12 may be configured so as to be incorporated into the unit circuit 11 contained in the shift register 10 according to Embodiment 1 or into the unit circuit 31 contained in the shift register 30 according to Embodiment 3 (which are shown in FIGS. 14 and 15, respectively). This makes it possible to carry out all-on operation while fixing the potential at the node N1 at VSS, regardless of the levels of the input signal IN and the clock signals CK and CKB.

Embodiment 5

Figure 16:
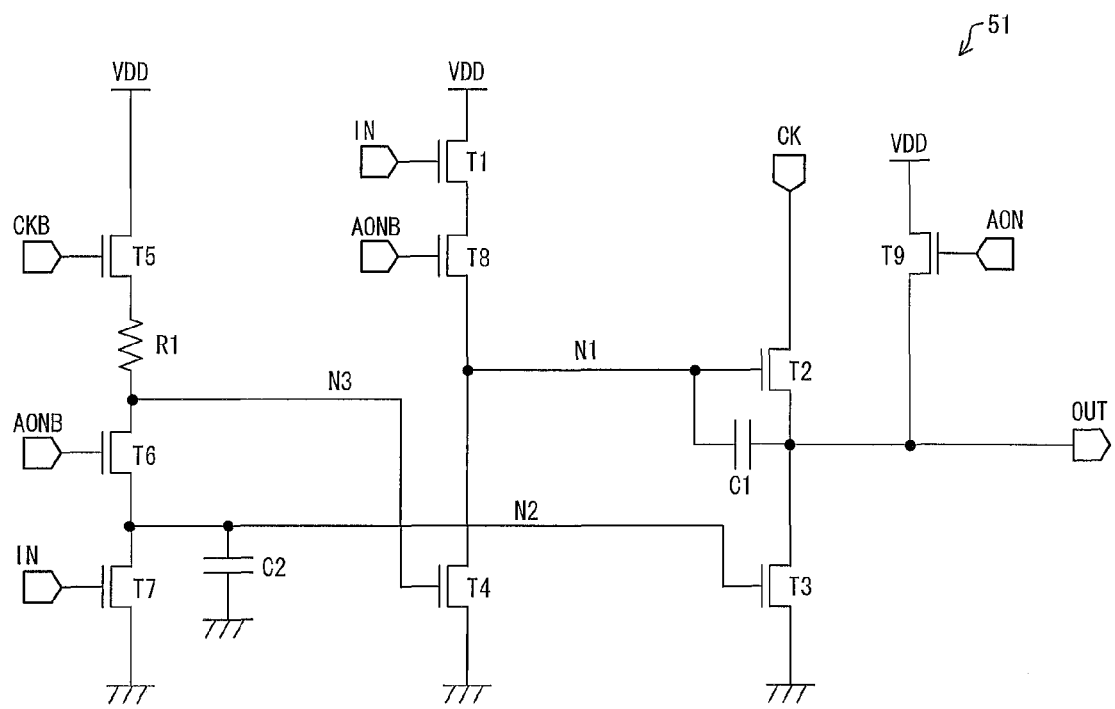
FIG. 16 is a circuit diagram of a unit circuit contained in a shift register according to Embodiment 5 of the present invention.

Embodiment 5 of the present invention is described below. A shift register 50 according to Embodiment 5 (not illustrated) is configured in the same manner as the shift register 10 according to Embodiment 1 as shown in FIG. 1. FIG. 16 is a circuit diagram of a unit circuit 51 contained in the shift register 50. The unit circuit 51 shown in FIG. 16 is a circuit in which the transistors T1 and T8 are connected in a way opposite to the way they are connected in the unit circuit 11 (see FIG. 2) contained in the shift register 10 according to Embodiment 1.

As shown in FIG. 16, the transistor T1 has its drain terminal to be supplied with the power supply voltage VDD, its source terminal connected to the drain terminal of the transistor T8, and its gate terminal connected to the input terminal IN. Further, the transistor T8 has its source terminal connected to a point of connection (node N1) between the gate terminal of the transistor T2 and the drain terminal of the transistor T4. The transistor T8 has its gate terminal connected to the all-on control terminal AONB.

Since normal operation of the shift register 50 is identical to the normal operation of the shift register 10, the following description discusses all-on operation. FIG. 17 is a timing chart of all-on operation of the shift register 50. During all-on operation, the all-on control signal AON is at a high level, and the all-on control signal AONB is at a low level. Further, the start pulse ST and the clock signals CK and CKB are each set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistor T3 is brought into an OFF state. Further, since the clock signal CKB is at a high level, the transistor T5 is in an ON state and the potential at the node N3 is VDD-Vth (where Vth is the threshold voltage of the transistor T5), so that the transistor T4 is in an ON state. Further, since the all-on control signal AONB is at a low level, the transistor T8 is in an OFF state. This causes the potential at the node N1 to be VSS, so that the transistor T2 is brought into an OFF state. At this point in time, since the all-on control signal AON is at a high level, the transistor T9 is in an ON state, and an output signal OUT at a level of VDD-Vth (where Vth is the threshold voltage of the transistor T9) is outputted via the output terminal OUT. The output signal OUT is outputted to the outside as the output signal SROUT1, and is supplied to the subsequent unit circuit 51 via its input terminal IN. The subsequent unit circuit 51 carries out the same operation as the first unit circuit 51.

Thus, during all-on operation, output signals OUT at a high level of VDD-Vth are outputted via all of the output terminals OUT1 to OUTn over the periods t0 to tn+1.

Embodiment 6

Figure 18:
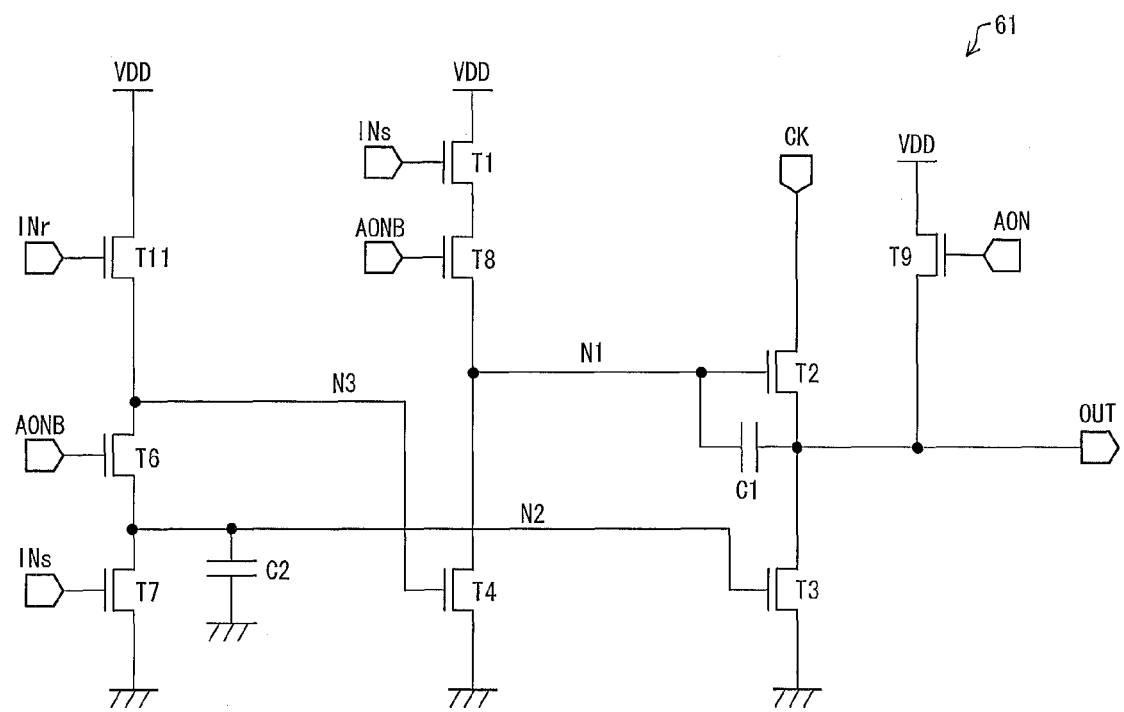
FIG. 18 is a circuit diagram of a unit circuit contained in a shift register according to Embodiment 6 of the present invention.

Embodiment 6 of the present invention is described below. A shift register 60 according to Embodiment 6 (not illustrated) is configured in the same manner as the shift register 30 according to Embodiment 3 as shown in FIG. 8. FIG. 18 is a circuit diagram of a unit circuit 61 contained in the shift register 60. The unit circuit 61 shown in FIG. 18 is a circuit in which the transistors T1 and T8 are connected in a way opposite to the way they are connected in the unit circuit 31 (see FIG. 9) contained in the shift register 30 according to Embodiment 3.

As shown in FIG. 18, the transistor T1 has its drain terminal to be supplied with the power supply voltage VDD, its source terminal connected to the drain terminal of the transistor T8, and its gate terminal connected to the input terminal INs. Further, the transistor T8 has its source terminal connected to a point of connection (node N1) between the gate terminal of the transistor T2 and the drain terminal of the transistor T4. The transistor T8 has its gate terminal connected to the all-on control terminal AONB.

Since normal operation of the shift register 50 is identical to the normal operation of the shift register 30, the following description discusses all-on operation. FIG. 19 is a timing chart of all-on operation of the shift register 50. During all-on operation, the all-on control signal AON is at a high level, and the all-on control signal AONB is at a low level. Further, the start pulse ST and the clock signals CK and CKB are each set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistor T3 is brought into an OFF state. Further, since the input signal INr is at a high level, the transistor T11 is in an ON state and the potential at the node N3 is VDD-Vth (where Vth is the threshold voltage of the transistor T11), so that the transistor T4 is in an ON state. Further, since the all-on control signal AONB is at a low level, the transistor T8 is in an OFF state. This causes the potential at the node N1 to be VSS, so that the transistor T2 is brought into an OFF state. At this point in time, since the all-on control signal AON is at a high level, the transistor T9 is in an ON state, so that the output signal OUT at a level of VDD-Vth (where Vth is the threshold voltage of the transistor T9) is outputted via the output terminal OUT. This output signal OUT is outputted to the outside as the output signal SROUT1, and is supplied to the subsequent unit circuit 61 via its input terminal INs. In the second and latter stages, the output signal OUT is outputted to the outside and is supplied to its corresponding subsequent unit circuit 61 via the input terminal INs of that subsequent unit circuit 61 and to its corresponding preceding unit circuit 61 via the input terminal INr of that preceding unit circuit 61.

Thus, during all-on operation, output signals OUT at a high level of VDD-Vth are outputted via all of the output terminals OUT1 to OUTn over the periods t0 to tn+1.

Embodiment 7

Figure 20:
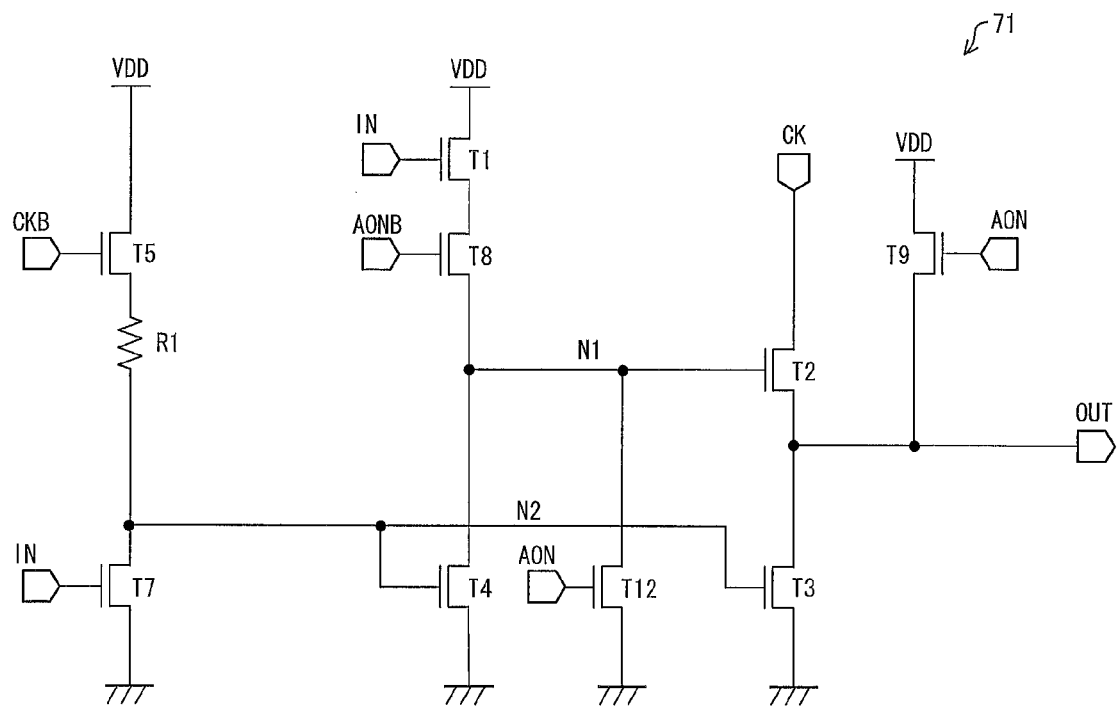
FIG. 20 is a circuit diagram of a unit circuit contained in a shift register according to Embodiment 7 of the present invention.

Embodiment 7 of the present invention is described below. A shift register 70 according to Embodiment 7 (not illustrated) is configured in the same manner as the shift register 10 according to Embodiment 1 as shown in FIG. 1. FIG. 20 is a circuit diagram of a unit circuit 71 contained in the shift register 70.

As shown in FIG. 20, the unit circuit 71 is constituted by transistors of the same conductivity type, and includes nine N-channel transistors T1 to T5, T7 to T9, and T12, two capacitors C1 and C2, and a single resistor R1.

The transistor T1 has its drain terminal to be supplied with the power supply voltage VDD, its source terminal connected to the drain terminal of the transistor T8, and its gate terminal connected to the input terminal IN. Further, the transistor T8 has its source terminal connected to a point of connection (node N1) between the gate terminal of the transistor T2 and the drain terminal of the transistor T4. The transistor T8 has its gate terminal connected to the all-on control terminal AONB. The transistor T12 has its drain terminal connected to the node N1, its gate terminal connected to the all-on terminal AON, and its source terminal grounded.

The transistor T5 has its drain terminal to be supplied with the power supply voltage VDD, its source terminal connected to one end of the resistor R1, and has its gate terminal to be supplied with the clock signal CKB. The transistor T7 has its drain terminal connected to the other end of the resistor R1, its gate terminal connected to the input terminal IN, and its source terminal grounded. The transistor T7 and the resistor R1 are connected at a point of connection (node N2) to which the gate terminal of the transistor T4 and the gate terminal of the transistor T3 are also connected.

Since normal operation of the shift register 70 is identical to the normal operation of the shift register 10, the following description discusses all-on operation. FIG. 21 is a timing chart of all-on operation of the shift register 70. During all-on operation, the all-on control signal AON is at a high level (active), and the all-on control signal AONB is at a low level. Further, the start pulse ST is set at a high level, and the clock signals CK and CKB are each set at a low level.

Since the start pulse ST is at a high level, the transistor T7 is in an ON state, and since the clock signal CKB is at a low level, the transistor T5 is in an OFF state. This causes the potential at the node N2 to be VSS, so that the transistors T3 and T4 are brought into an OFF state. Further, since the all-on control signal AON is at a high level, the transistors T12 and T9 are in an ON state. Further, since the all-on control signal AONB is at a low level, the transistor T8 is in an OFF state. This causes the potential at the node N1 to be VSS, so that the transistor T2 is brought into OFF state and an output signal OUT at a level of VDD-Vth (where Vth is the threshold voltage of the transistor T9) is outputted via the output terminal OUT. This output signal OUT is outputted to the outside as the output signal SROUT1, and is supplied to the subsequent unit circuit 71 via its input terminal IN. The subsequent unit circuit 71 carries out the same operation as the first unit circuit 71.

Thus, during all-on operation, output signals OUT at a high level of VDD-Vth are outputted via all of the output terminals OUT1 to OUTn over the periods t0 to tn+1.

The shift register 70 of Embodiment 7 is provided with the transistor T12, can therefore causes the potential at the node N1 to be fixed at VSS during all-on operation. That is, it is possible to carry out all-on operation while fixing the potential at the node N1 at VSS, regardless of the levels of the clock signals CK and CKB.

Embodiment 8

Figure 22:
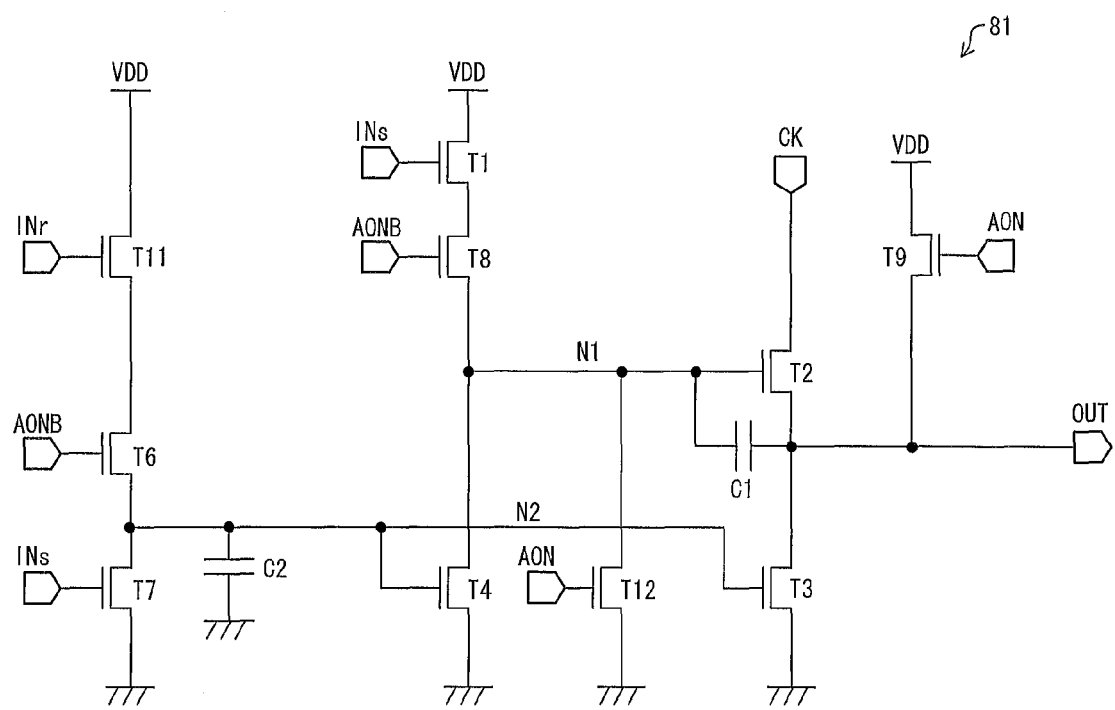
FIG. 22 is a circuit diagram of a unit circuit contained in a shift register according to Embodiment 8 of the present invention.

Embodiment 8 of the present invention is described below. A shift register 80 according to Embodiment 8 (not illustrated) is configured in the same manner as the shift register 30 according to Embodiment 3 as shown in FIG. 8. FIG. 22 is a circuit diagram of a unit circuit 81 contained in the shift register 80. The unit circuit 81 shown in FIG. 22 is a circuit obtained by incorporating a transistor T12 into the unit circuit 61 (see FIG. 18) contained in the shift register 60 according to Embodiment 6.

As shown in FIG. 22, the transistor T12 has its drain terminal connected to the node N1, its gate terminal connected to the all-on control terminal AON, and its source terminal grounded. Further, unlike in the unit circuit 61, the transistor T4 has its gate terminal connected to the node N2.

Since normal operation of the shift register 80 is identical to the normal operation of the shift register 30, the following description discusses all-on operation. FIG. 23 is a timing chart of all-on operation of the shift register 80. During all-on operation, the all-on control signal AON is at a high level (active), and the all-on control signal AONB is at a low level. Further, the start pulse ST and the clock signals CK and CKB are each set at a high level.

Since the start pulse ST is at a high level, the transistor T7 is in an ON state, and since the all-on control signal AONB is at a low level, the transistor T6 is in an OFF state. This causes the potential at the node N2 to be VSS, so that the transistors T3 and T4 are brought into an OFF state. Further, since the all-on control signal AON is at a high level, the transistors T12 and T9 are in an ON state, and since the all-on control signal AONB is at a low level, the transistor T8 is in an OFF state. This causes the potential at the node N1 to be VSS, so that the transistor T2 is brought into an OFF state and an output signal OUT at a level of VDD-Vth (where Vth is the threshold voltage of the transistor T9) is outputted via the output terminal OUT. This output signal OUT is outputted to the outside as the output signal SROUT1, and is supplied to the subsequent unit circuit 81 via its input terminal INs. In the second and latter stages, the output signal OUT is outputted to the outside and is supplied to its corresponding subsequent unit circuit 81 via the input terminal INs of that subsequent unit circuit 81 and to its corresponding preceding unit circuit 81 via the input terminal INr of that preceding unit circuit 81.

Thus, during all-on operation, output signals OUT at a high level of VDD-Vth are outputted via all of the output terminals OUT1 to OUTn over the periods t0 to tn+1.

The shift register 80 of Embodiment 8 is provided with the transistor T12, and therefore causes the potential at the node N1 to be fixed at VSS during all-on operation. That is, it is possible to carry out all-on operation while fixing the potential at the node N1 at VSS, regardless of the levels of the clock signals CK and CKB.

Embodiment 9

Figure 24:
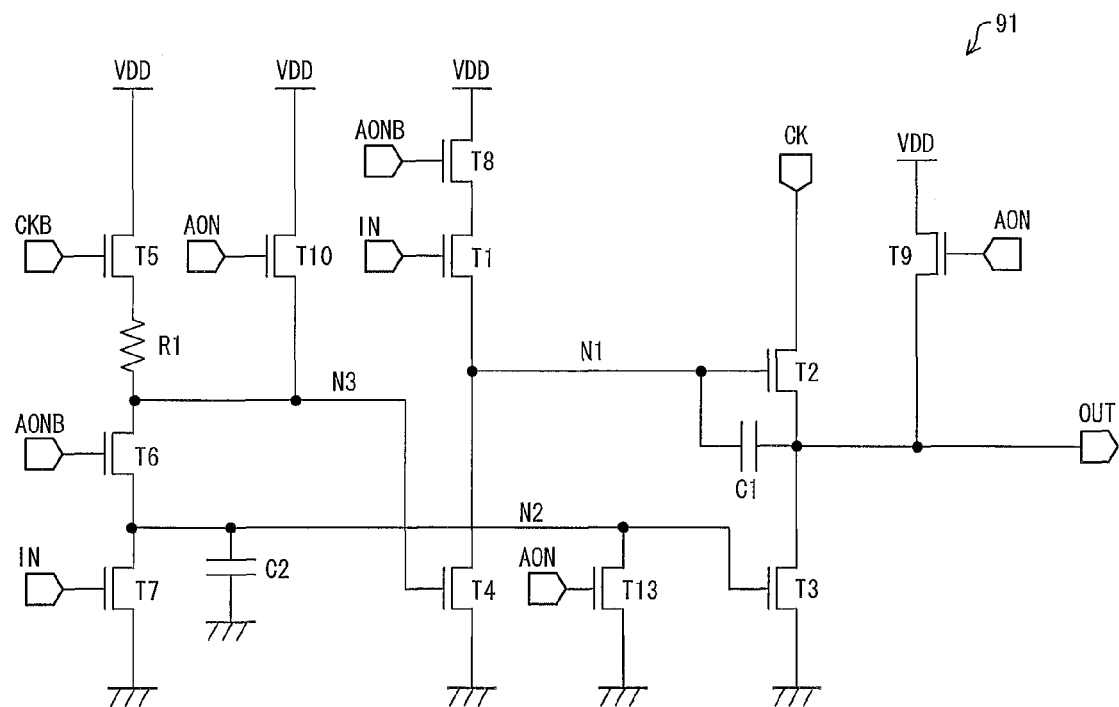
FIG. 24 is a circuit diagram of a unit circuit contained in a shift register according to Embodiment 9 of the present invention.

Embodiment 9 of the present invention is described below. A shift register 90 according to Embodiment 9 is configured in the same manner as the shift register 10 according to Embodiment 1 as shown in FIG. 1. FIG. 24 is a circuit diagram of a unit circuit 91 contained in the shift register 90. The unit circuit 91 shown in FIG. 24 is a unit circuit obtained by incorporating a transistor T13 into the unit circuit 21 (see FIG. 5) contained in the shift register 20 according to Embodiment 2. It should be noted that the transistor T13 functions as an output reset transistor.

As shown in FIG. 24, the transistor T13 has its drain terminal connected to the node N2, its gate terminal connected to the all-on control terminal AON, and its source terminal grounded.

Since normal operation of the shift register 90 is identical to the normal operation of the shift register 10, the following description discusses all-on operation. FIG. 25 is a timing chart of all-on operation of the shift register 90. During all-on operation, the all-on control signal AON is at a high level, and the all-on control signal AONB is at a low level. Moreover, the start pulse ST and the clock signals CK and CKB are each set at a low level.

Since the start pulse ST is at a low level, the transistor T7 is in an OFF state, and since the all-on control signal AONB is at a low level, the transistor T6 also is in an OFF state. Since the node N2 is connected to the transistor T13, so that when the all-on control signal AON is at a high level, the potential at the node N2 is VSS and the transistor T3 is in an OFF state. Further, since the all-on control signal AON is at a high level, the transistor T10 is in an ON state, so that the potential at the node N3 is VDD-Vth (where Vth is the threshold value of the transistor T10). This causes the transistor T4 to be in an ON state. Further, since the all-on control signal AONB is at a low level, the transistor T8 is in an OFF state. This causes the potential at the node N1 to be VSS, so that the transistor T2 is brought into an OFF state. Further, since the transistor T9 is in an ON state, an output signal OUT at a level of VDD-Vth (where Vth is the threshold voltage of the transistor T9) is outputted via the output terminal OUT. This output signal OUT is outputted to the outside as the output signal SROUT1 and is supplied to the subsequent unit circuit 91 via its input terminal IN. The subsequent unit circuit 91 carries out the same operation as the first unit circuit 91.

The shift register 90 of the present embodiment is provided with the transistor T13, and therefore causes the potential at the node N2 to be fixed at VSS during all-on operation. That is, it is possible to surely bring the transistor T3 into an OFF state while fixing the potential at the node N2 at VSS, regardless of the levels of the start pulse ST and the clock signals CK and CKB. This makes it possible to stabilize all-on operation.

It should be noted that the start pulse ST and the clock signals CK and CKB may each be at a high level.

Embodiment 10

Figure 26:
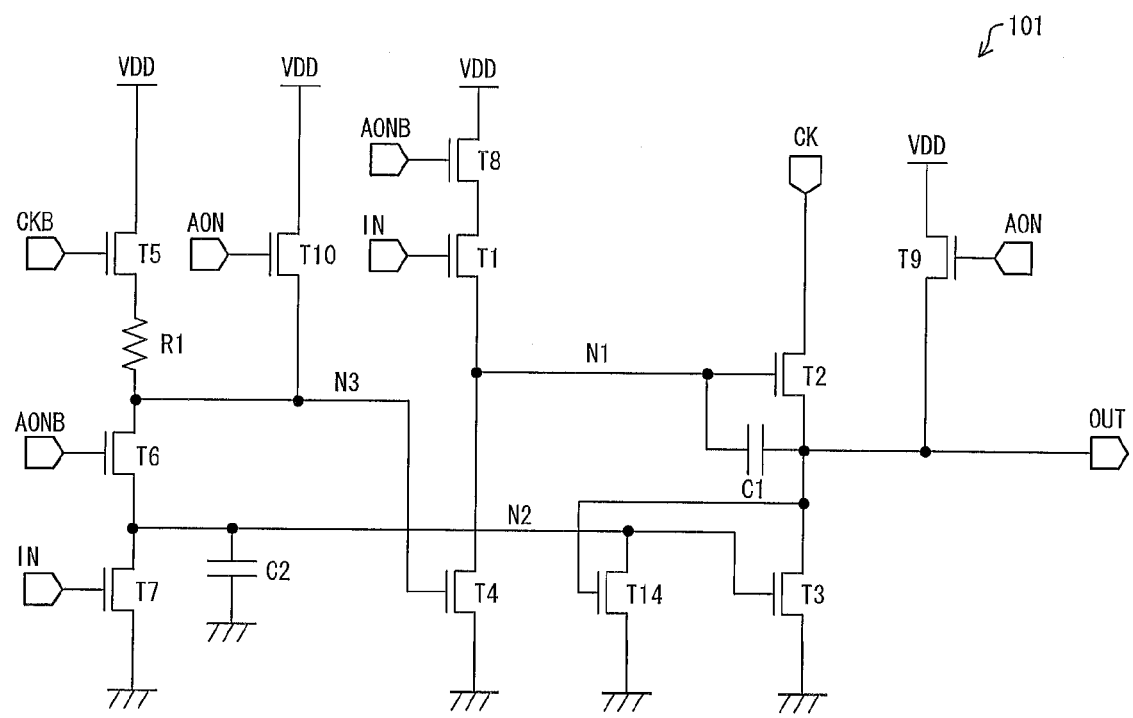
FIG. 26 is a circuit diagram of a unit circuit contained in a shift register according to Embodiment 10 of the present invention.

Embodiment 10 according to the present invention is described below. A shift register 100 according to Embodiment 10 (not illustrated) is configured in the same manner as the shift register 10 according to Embodiment 1 as shown in FIG. 1. FIG. 26 is a circuit diagram of a unit circuit 101 contained in the shift register 100. The unit circuit 101 shown in FIG. 26 is a unit circuit obtained by incorporating a transistor T14 into the unit circuit 21 (see FIG. 5) contained in the shift register 20 according to Embodiment 2.

As shown in FIG. 26, the transistor T14 has its drain terminal connected to the node N2, its gate terminal connected to (i) the drain terminal of the transistor T3, (ii) the source terminal of the transistor T2, and (iii) the source terminal of the transistor T9, and its source terminal grounded.

Since normal operation of the shift register 100 is identical to the normal operation of the shift register 10, the following description discusses all-on operation. FIG. 27 is a timing chart of all-on operation of the shift register 100. During all-on operation, the all-on control signal AON is at a high level, and the all-on control signal AONB is at a low level. Further, the start pulse ST and the clock signals CK and CKB are each set at a low level.

Since the start pulse ST is at a low level, the transistor T7 is in an OFF state, and since the all-on control signal AONB is at a low level, the transistor T6 is also in an OFF state. Since the all-on control signal AON is at a high level, the transistor T9 is in an ON state, so that the transistor T14 has its gate terminal supplied with VDD to be in an ON state. This causes the potential at the node N2 to be VSS, so that the transistor T3 is brought into an OFF state. Moreover, since the all-on control signal AON is at a high level, the transistor T10 is in an ON state and the potential at the node N3 is VDD-Vth (where Vth is the threshold voltage of the transistor T10). This causes the transistor T4 to be in an ON state. Further, since the all-on control signal AONB is at a low level, the transistor T8 is in an OFF state. This causes the potential at the node N1 to be VSS, so that the transistor T2 is brought into an OFF state. Further, since the transistor T9 is in an ON state, an output signal OUT at a level of VDD-Vth (where Vth is the threshold voltage of the transistor T9) is outputted via the output terminal OUT. This output signal OUT is outputted to the outside as the output signal SROUT1 and is supplied to the subsequent unit circuit 101 via its input terminal IN. The subsequent unit circuit 101 carries out the same operation as the first unit circuit 101.

The shift register 100 of the present embodiment is provided with the transistor T14, and therefore causes the potential at the node N2 to be fixed at VSS during all-on operation. That is, it is possible to surely bring the transistor T3 into an OFF state while fixing the potential at the node N2 at VSS, regardless of the levels of the start pulse ST and the clock signals CK and CKB. This makes it possible to stabilize all-on operation. It should be noted that the start pulse ST and the clock signals CK and CKB may each be at a high level.

Although each of the unit circuits of each of the embodiments described above is constituted by N-channel transistors, this does not imply any limitation, and each of the unit circuits may alternatively be constituted by P-channel transistors.

(Display Device)

Figure 28:
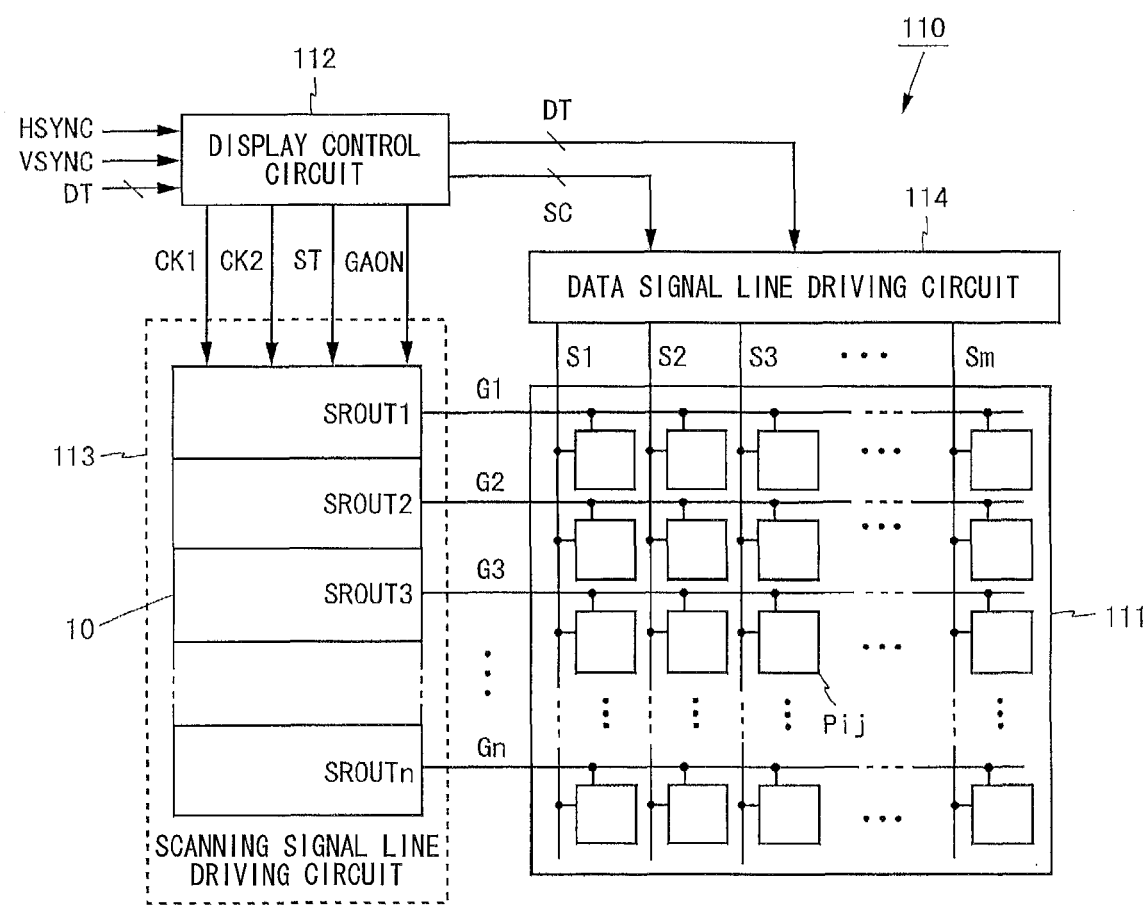
FIG. 28 is a block diagram schematically showing a configuration of a liquid crystal display device including a shift register of the present invention.

Each of the shift registers described above is applicable, for example, to a display device or the like of a driving circuit or of an imaging device. FIG. 28 is a block diagram schematically showing a configuration of a liquid crystal display device 110 including a shift register of the present invention.

A liquid crystal display device 110 shown in FIG. 28 is an active matrix display device including a display section 111, a display control circuit 112, a scanning signal line driving circuit 113, and a data signal line driving circuit 114. In the liquid crystal display device 110, the shift register 10 is used as the scanning signal line driving circuit 113.

The display section 111 shown in FIG. 28 includes n scanning signal lines G1 to Gn, m data signal lines S1 to Sm, and (m×n) display elements Pij (where m is an integer of not less than 2, and j is an integer of not less than 1 but not more than m). The scanning signal lines G1 to Gn are arranged in parallel with each other, and the data signal lines S1 to Sm are arranged in parallel with each other in such a manner as to be at right angles to the scanning signal lines G1 to Gn. Each of the display elements Pij is provided near an intersection between a scanning signal line Gi and a data signal line Sj. As such, the (m×n) display elements Pij are arranged two-dimensionally by arranging m display elements Pij along a row-wise direction and n display elements Pij along a column-wise direction. The scanning signal line Gi is connected to all of the display elements Pij disposed on the ith row, and the data signal line Sj is connected to all of the display elements Pij disposed on the jth column.

Control signals, such as a horizontal synchronizing signal HSYNC and a vertical synchronizing signal VSYNC, and display data DT are supplied from a source outside of the liquid crystal display device 110. On the basis of these signals, the display control circuit 112 outputs the clock signals CK1, CK2, the start pulse ST, and the all-on control signals GAON and GAONB to the scanning signal line driving circuit 113, and outputs the control signal SC and the display data DT to the data signal line driving circuit 114.

The scanning signal line driving circuit 113 is constituted by a shift register 10 having n stages. When a low-level all-on control signal GAON and a high-level all-on control signal GAONB are supplied to the shift register 10, the shift register 10 carries out normal operation. That is, on the basis of the clock signals CK1 and CK2, the shift register 10 sequentially raises the output signals SROUT1 to SROUTn to a high level (to exhibit a selected state) one by one at a time. The output signals SROUT1 to SROUTn are supplied to the scanning signal lines G1 to Gn, respectively. As a result, the scanning signal lines G1 to Gn are sequentially selected one by one at a time, and the display elements Pij of one entire row are selected at once.

On the basis of the control signal SC and the display data DT, the data signal line driving circuit 114 supplies voltages to the data signal lines S1 to Sm in accordance with the display data DT. As a result, the voltages according to the display data DT are written into the display elements Pij of the selected one row. This is how the liquid crystal display device 110 displays a picture.

On the other hand, when a high-level all-on control signal GAON and a low-level all-on control signal GAONB are supplied to the scanning signal line driving circuit 113, the shift register 10 carries out all-on operation. Accordingly, the high-level output signals SROUT1 to SROUTn are simultaneously supplied to the scanning signal lines G1 to Gn, respectively. As a result, a voltage according to the display data DT is written into all of the display elements Pij.

Figure 29:
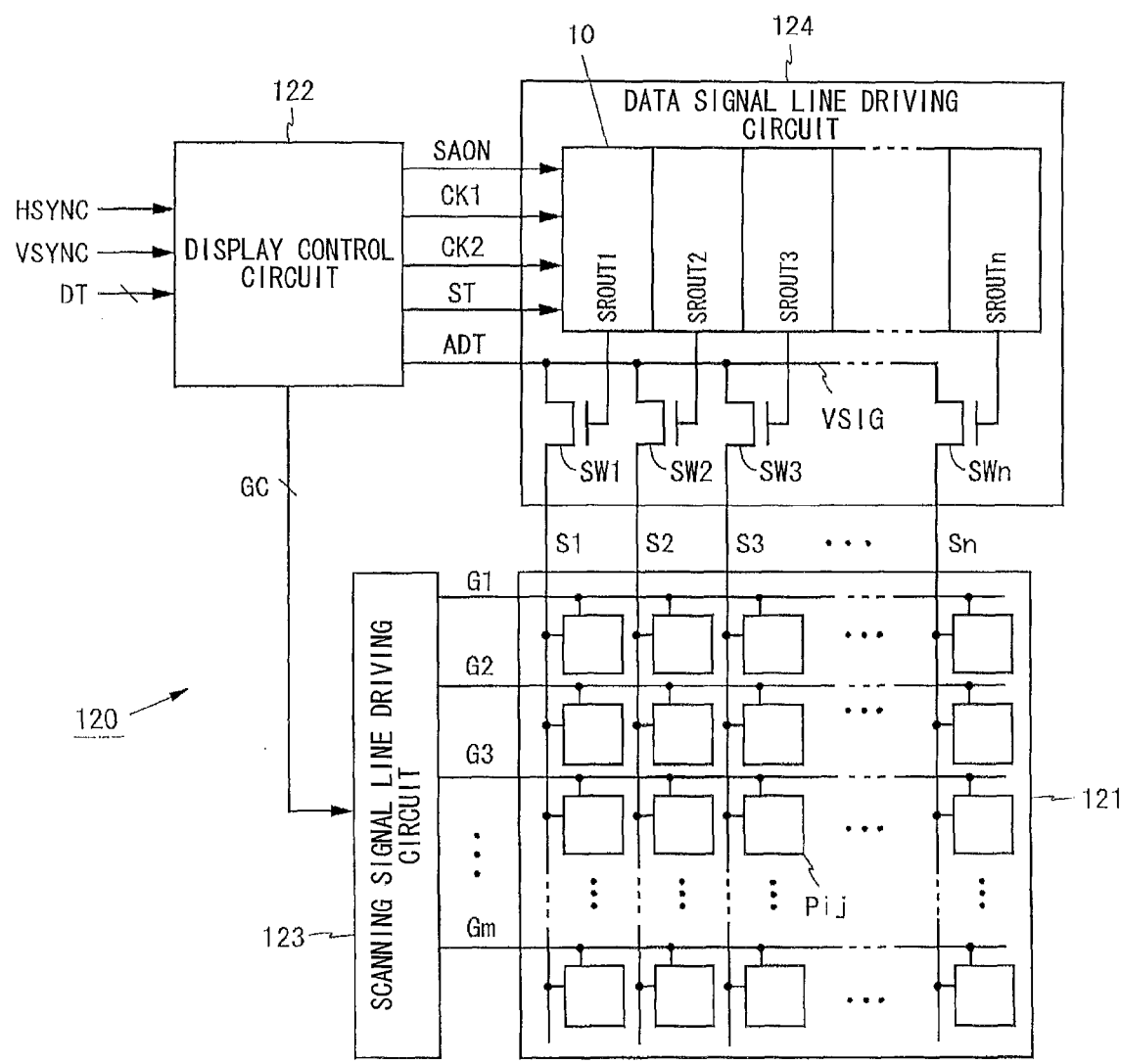
FIG. 29 is a block diagram schematically showing a configuration of another liquid crystal display device including a shift register of the present invention.

FIG. 29 is a block diagram schematically showing a configuration of a liquid crystal display device 120 including a shift register 10. The liquid crystal display device 120 shown in FIG. 29 is an active matrix display device including a display section 121, a display control circuit 122, a scanning signal line driving circuit 123, and a data signal line driving circuit 124. In the liquid crystal display device 120, the shift register 10 is built in the data signal line driving circuit 124, which carries out dot-sequential driving.

The display section 121 shown in FIG. 29 is configured in a similar manner to the display section 111 shown in FIG. 28. However, in the display section 121, the number of the scanning signal lines provided is m and the number of the data signal lines provided is n, and further the display elements Pij provided by the number of (m×n) are arranged in a two-dimensional manner such that n display elements are arranged along the row-wise direction and m display elements are arranged along the column-wise direction.

On the basis of on the control signal and display data DT supplied from an outside source, the display control circuit 122 outputs the control signal GC to the scanning signal line driving circuit 123, and outputs the clock signals CK1 and CK2, the start pulse ST, the analog video data ADT, and the all-on control signals SAON and SAONB to the data signal line driving circuit 124. The scanning signal line driving circuit 123 sequentially selects the scanning signal lines G1 to Gm one by one at a time in accordance with the control signal GC.

The data signal driving circuit 124 includes (i) a shift register having n stages and (ii) n sampling switches SW1 to SWn constituted by N-channel transistors. The sampling switches SW1 to SWn each have one end connected to the data signal lines S1 to Sn, respectively, and each have the other end connected to a video signal line VSIG through which the analog video data ADT is transmitted. The N-channel transistors serving as the sampling switches SW1 to SWn has their gate terminals to be supplied with the respective output signals SROUT1 to SROUTn from the shift register 10.

When the low-level all-on control signal SAON and the high-level all-on control signal SAONB are supplied to the data signal line driving circuit 124, the shift register 10 carries out normal operation. In this case, the output signals SROUT1 to SROUTn is sequentially raised to a high level one by one at a time. This causes the sampling switches SW1 to SWn to be sequentially brought into an ON state one by one at a time, and thus the analog video data ADT is supplied to the data signal lines connected to the sampling switches in the ON state. This causes voltages according to the analog video data ADT to be sequentially written into the display elements Pij of the one row selected by the scanning signal line driving circuit 123, one by one at a time. This is how the liquid crystal display device 120 displays a picture.

On the other hand, when the high-level all-on control signal SAON and the low-level all-on control signal SAONB are supplied to the data signal line driving circuit 124, the shift register 10 carries out all-on operation. At this point in time, the high-level output signals SROUT1 to SROUTn are simultaneously supplied from the shift register 10 to the sampling switches SW1 to SWn via their gate terminals, respectively. As a result of this, the sampling switches SW1 to SWn are simultaneously brought into an ON state, and the analog video data ADT is simultaneously supplied to all of the data signal lines S1 to Sn. Consequently, voltages according to the analog video data ADT are simultaneously written into the display elements Pij of the one row selected by the scanning signal line driving circuit 123.

Figure 30:
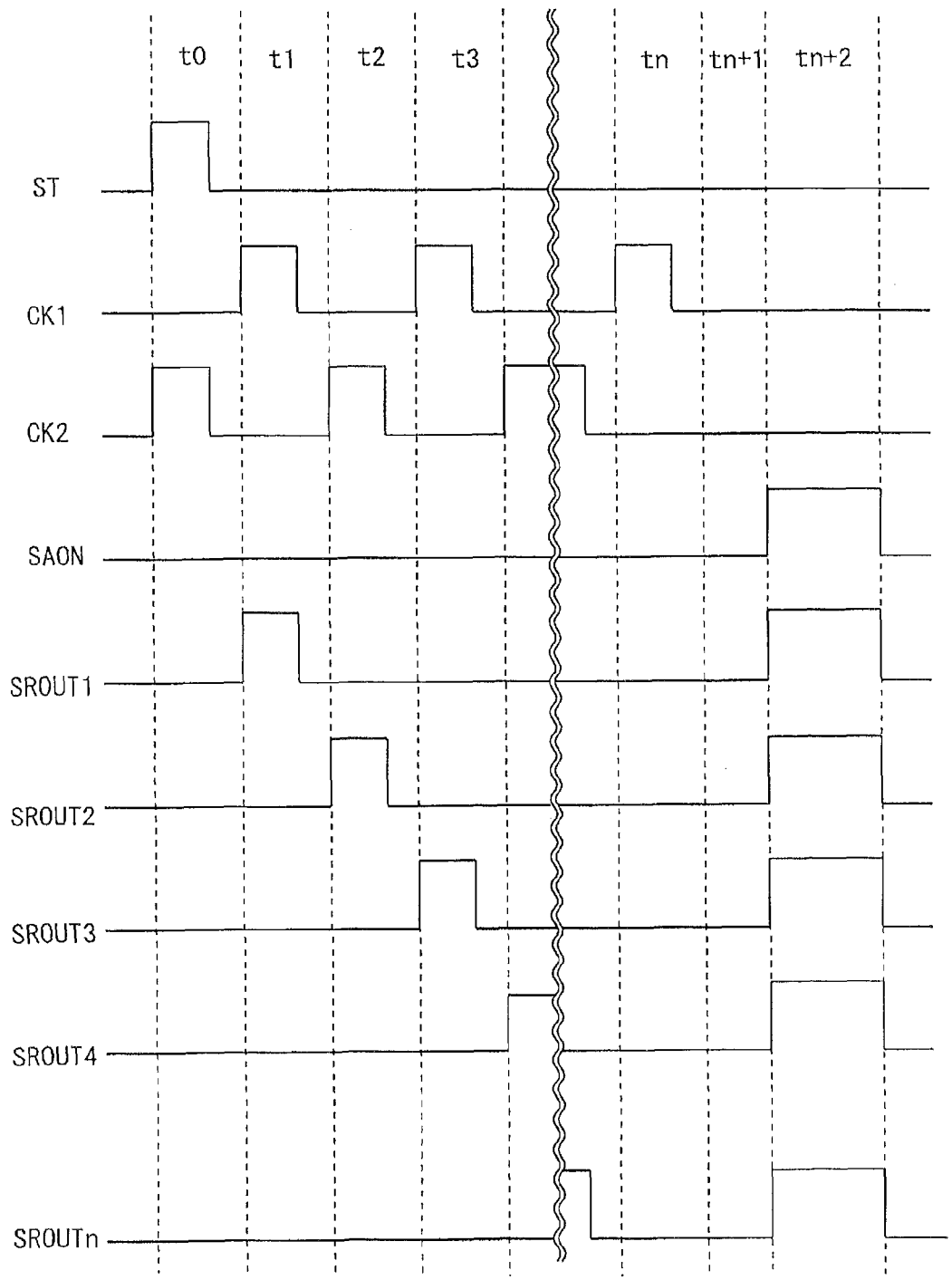
FIG. 30 is a timing chart showing operation of the liquid crystal display device shown in FIG. 29.

FIG. 30 is a timing chart showing operation of the liquid crystal display device 120. As shown in FIG. 30, the shift register 10 contained in the data signal line driving circuit 124 carries out normal operation during the periods t0 to tn. At this point in time, the data signal lines S1 to Sn sequentially receive the high-level output signals SROUT1 to SROUTn, respectively, one by one at a time. During the period t(n+2), the all-on control signal SAON is in a high level, and thus the shift register 10 carries out all-on operation. At this point in time, the high-level output signals SROUT1 to SROUTn are simultaneously outputted to the data signal lines S1 to Sn, respectively.

A liquid crystal display device including either a scanning signal line driving circuit containing a shift register 10 or a data signal line driving circuit containing a shift register 10 may show a disturbance in a picture when the power supply circuit has been (i) turned on, (ii) turned off, or (iii) forcibly turned off. However, by carrying out all-on operation with the shift register contained in the scanning signal line driving circuit or in the data signal line driving circuit, such a disturbance in a picture can be held down to such an extent that it cannot be perceived by a human eye. The following description discusses each of these cases.

<How a Liquid Crystal Display Device Operates when the Power Supply Circuit has been Turned on>

Figure 31:
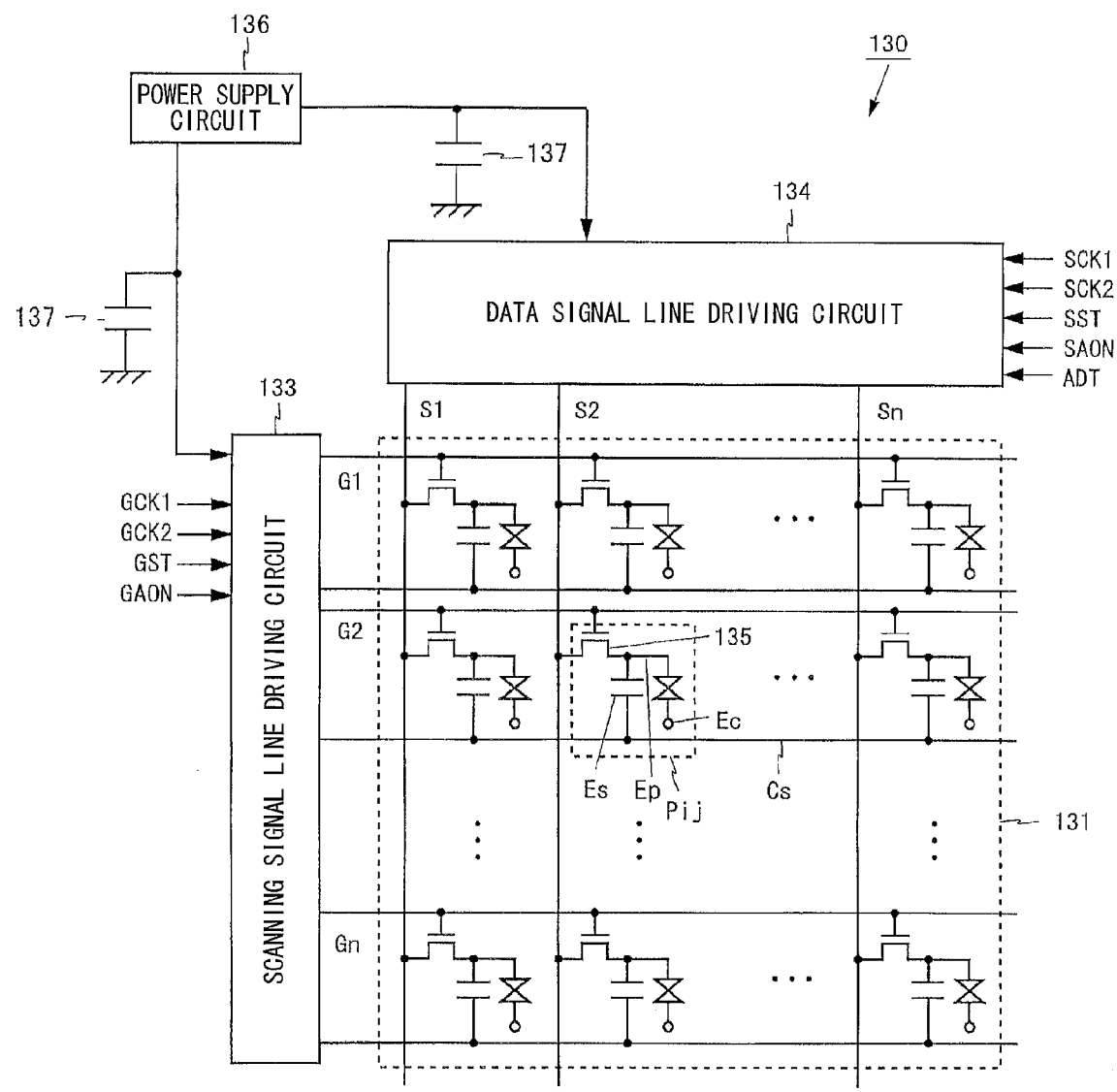
FIG. 31 is a block diagram schematically showing a configuration of another liquid crystal display device including a shift register of the present invention.

FIG. 31 is a block diagram showing a configuration of still another liquid crystal display device 130. The liquid crystal display device 130 shown in FIG. 31 is an active matrix display device including a display section 131, a scanning signal line driving circuit 133, and a data signal line driving circuit 134. The scanning signal line driving circuit 133 and the data signal line driving circuit 134 each contain a shift register 10, and the liquid crystal display device 130 is driven by dot-sequential driving. Further, the scanning signal line driving circuit 133 and the data signal line driving circuit 134 are connected to a power supply circuit 136 that supplies power supply voltages VH and VL, with a capacitive element 137 provided between a terminal of the power supply circuit 136 and the ground terminal.

The display section 131 includes n scanning signal lines G1 to Gn, n data signal lines S1 to Sn, and (n×n) display elements Pij. The scanning signal lines G1 to Gn are arranged in parallel with each other, and the data signal lines S1 to Sn are arranged in parallel with each other in such a manner as to be at right angles to the scanning signal lines G1 to Gn. Each of display elements Pij is provided near an intersection between a scanning signal line Gi and a data signal lines Sj. As such, the (n×n) display elements Pij are arranged two-dimensionally by arranging n display element Pij along a row-wise direction and n display elements Pij along a column-wise direction. The scanning signal line Gi is connected to all of the display elements Pij disposed on the ith row, and the data signal line Sj is connected to all of the display elements Pij disposed on the jth column.

Each of the display elements Pij is provided with a TFT 135 serving as a switching element. The TFT 135 has its gate electrode connected to a corresponding one of the scanning signal lines G1 to Gn and its drain electrode connected to a pixel electrode Ep. Provided facing the pixel electrode Ep is a common electrode Ec, so that a liquid crystal capacitor is formed by the pixel electrode Ep and the common electrode Ec. Further provided on a substrate on which the pixel electrode Ep is provided is a storage electrode Es, so that a storage capacitor is formed by the pixel electrode Ep and the storage electrode Es. The storage electrode Es is connected to a storage electrode driving signal line Cs, and the storage electrode driving signal line Cs is connected to the scanning signal line driving circuit 133 or to an external circuit.

The scanning signal line driving circuit 133 and the data signal line driving circuit 134 are each constituted by a shift register 10 having n stages. The scanning signal line driving circuit 133 is supplied with clock signals GCK1 and GCK2, a start pulse GST, and the all-on control signal GAON, and the data signal line driving circuit 134 is supplied with clock signals SCK1 and SCK2, a start pulse SST and an all-on control signal SAON. Since the scanning signal line driving circuit 133 and the data signal line driving circuit 134 operate in the same manner as the scanning signal line driving circuit 113 of the liquid crystal display device 110 and the data signal line driving circuit 124 of the liquid crystal display device 120, a description the operation of the scanning signal line driving circuit 133 and the data signal line driving circuit 134 is omitted here.

There may be a disturbance in a picture that is displayed on the display section 131 immediately after the power supply circuit 136 of the liquid crystal display device 130 thus configured has been turned on. A possible reason for this is as follows: The power supply voltages VH and VL have not yet risen to a sufficient level immediately after the power supply circuit 136 has been turned on; as a result, logic control of the liquid crystal display device 130 cannot be properly carried out, which causes unnecessary charges to flow from the video signal line VSIG into the display elements Pij, and/or causes a potential COM of the counter electrode Ec or a potential Cs of the storage electrode Es to become unstable, so that a charge is stored between the counter electrode Ec and the pixel electrode Ep.

Accordingly, by utilizing the fact that an instant release of the stored charge causes a distortion in a picture to be unperceivable to a human eye, the stored charge can be released in an instant by bringing the TFTs 135 in all of the display elements Pij into an ON state when the power supply circuit 136 has been turned on. For this reason, once the power supply voltages VH and VL rise to a sufficient level, the high-level (active) all-on control signals GAON and SAON are supplied to the scanning signal line driving circuit 133 and the data signal line driving circuit 134, respectively, so that the scanning signal line driving circuit 133 and the data signal line driving circuit 134 are caused to carry out all-on operation.

Figure 32:
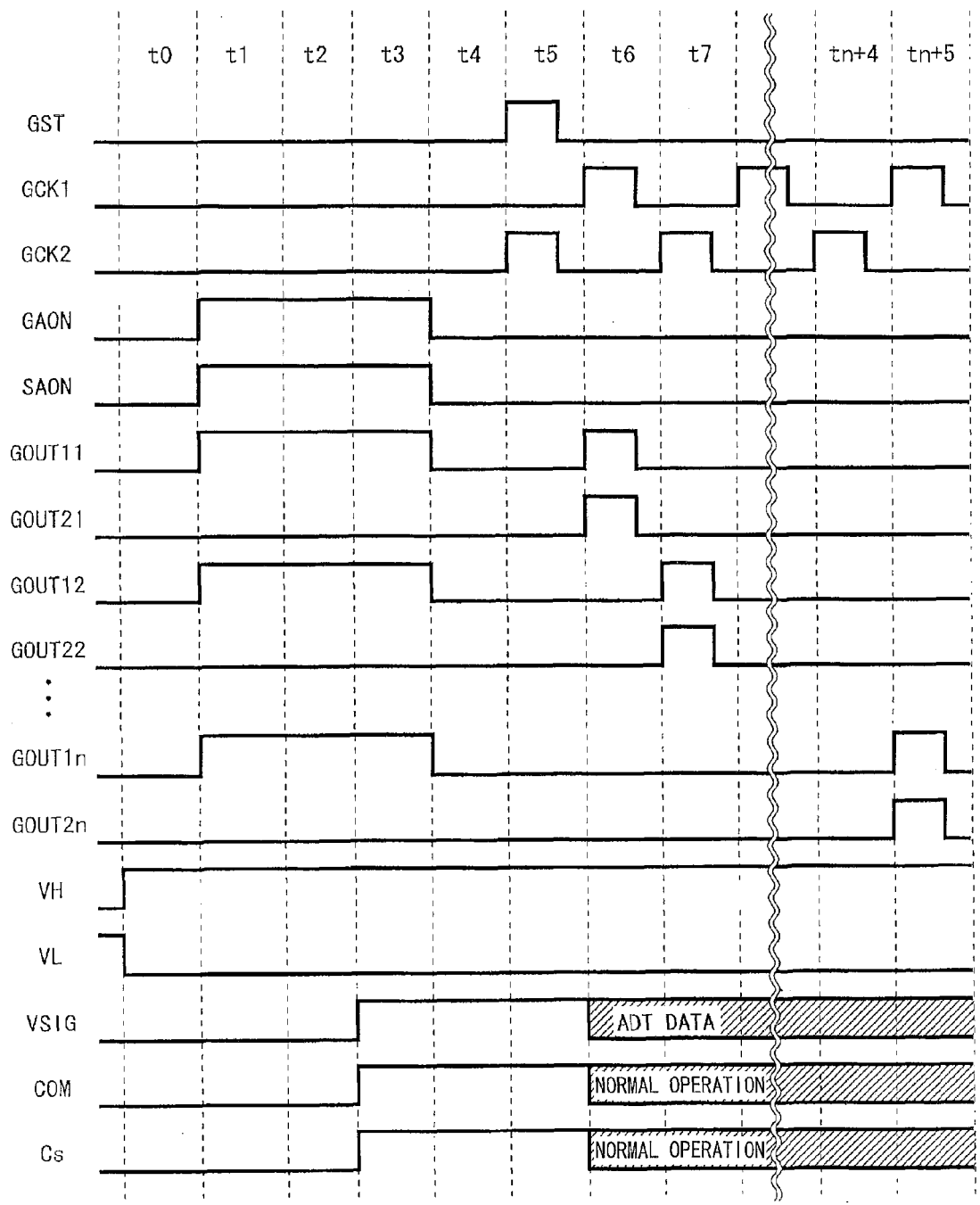
FIG. 32 is a timing chart showing operation of the liquid crystal display device shown in FIG. 31.

FIG. 32 is a timing chart showing operation of the liquid crystal display device 130. As shown in FIG. 32, when the power supply circuit 136 is turned on at the beginning of the period t0, the power supply voltages VH and VL rise to a sufficient level during the period t0. Next, the all-on control signals GAON and SAON are raised to a high level at the beginning of the period t1. At this point in time, the scanning signal line driving circuit 133 starts to carry out all-on operation, and supplies high-level output signals GOUT11 to GOUT1*n* to the scanning signal lines G1 to Gn, respectively. At this point in time, the data signal line driving circuit 134 also carries out all-on operation and simultaneously supplies the high-level output signals to the sampling switches SW1 to SWn, respectively.

As a result, the high-level output signals GOUT11 to GOUTn1 are supplied to the scanning signal lines G1 to Gn, respectively, so that the TFTs 135 are brought into an ON state. Further, all of the sampling switches SW1 to SWn are also in an ON state, and the data signal lines S1 to Sn are connected to the video signal line VSIG. Further, the video signal line VSIG, the potential COM of the counter electrode Ec, and the potential Cs of the storage electrode Es are each brought into a low level at the beginning of the period t1, so that the charges stored in the display elements Pij is released to the video signal line VSIG.

Furthermore, at the beginning of the period t3, the video signal line VSIG, the potential COM of the counter electrode Ec, and the potential Cs of the storage electrode Es are each brought into a high level, so that the display elements Pij are charged with an initial charge from the video signal line VSIG. The display elements Pij are charged with the initial charge since the picture may become disturbed when the potential COM of the counter electrode Ec and the potential Cs of the storage electrode Es are changed while the pixel electrode Ep is in a floating state. After that, at the end of the period t3, the all-on control signals GAON and SAON are brought into a low level, and normal operation is carried out from the beginning of the period t5, so that the analog video data ADT is transmitted to the video signal line VSIG from the beginning of the period t6.

It should be noted that in the foregoing description of the operation timing, the power supply circuit 136 was turned on at the beginning of the period t0 and the all-on operation was started from the beginning of the period t1. However, the all-on operation may be started from the beginning of the period t0 at the same time as the power supply circuit 136 is turned on. Moreover, FIG. 32 shows a case where the counter electrode Ec and the storage electrode Es are subjected to AC driving during normal operation. However, DC driving can be carried out instead.

Moreover, if the shift register 10 is caused to carry out all-on operation when the power supply circuit 136 has been turned on, the potential at the node N3 will be VDD-Vth, so that the transistor T4 is brought into an ON state. This causes the potential at the node N1 to be at a low level, so that the transistor T2 is brought into an OFF state. Further, the transistor T7 has its gate terminal supplied with a high-level start pulse ST, so that the transistor T7 is brought into an ON state. Accordingly, the transistor T3 is also brought into an OFF state. Further, the transistor T9 is brought into an ON state.

Next, when the shift register 10 returns from all-on operation to normal operation, the all-on control signal AON is at a low level, so that the transistor T9 is in an OFF state. On the other hand, the all-on control signal AONB is at a high level, so that the transistor T6 is in an ON state. For this reason, the transistor T3 is in an ON state, so that a low-level output signal OUT is outputted via the output terminal OUT. Therefore, there is no need to carry out initialization of the shift register 10 when returning from all-on operation to normal operation. As a result, the shift register 10 can return to normal operation quickly to the extent that initialization is unnecessary. Further, since it is not necessary to provide an initialization circuit is in a unit circuit 11 of the shift register 10, the shift register 10 can be made smaller.

<How a Liquid Crystal Display Device Operates when the Power Supply Circuit has been Turned Off>

The following describes a method for, in response to instructions provided from outside or instructions generated internally, suppressing a disturbance in a picture that is generated when the power supply circuit 136 of the liquid crystal display device 130 has been turned off.

Figure 33:
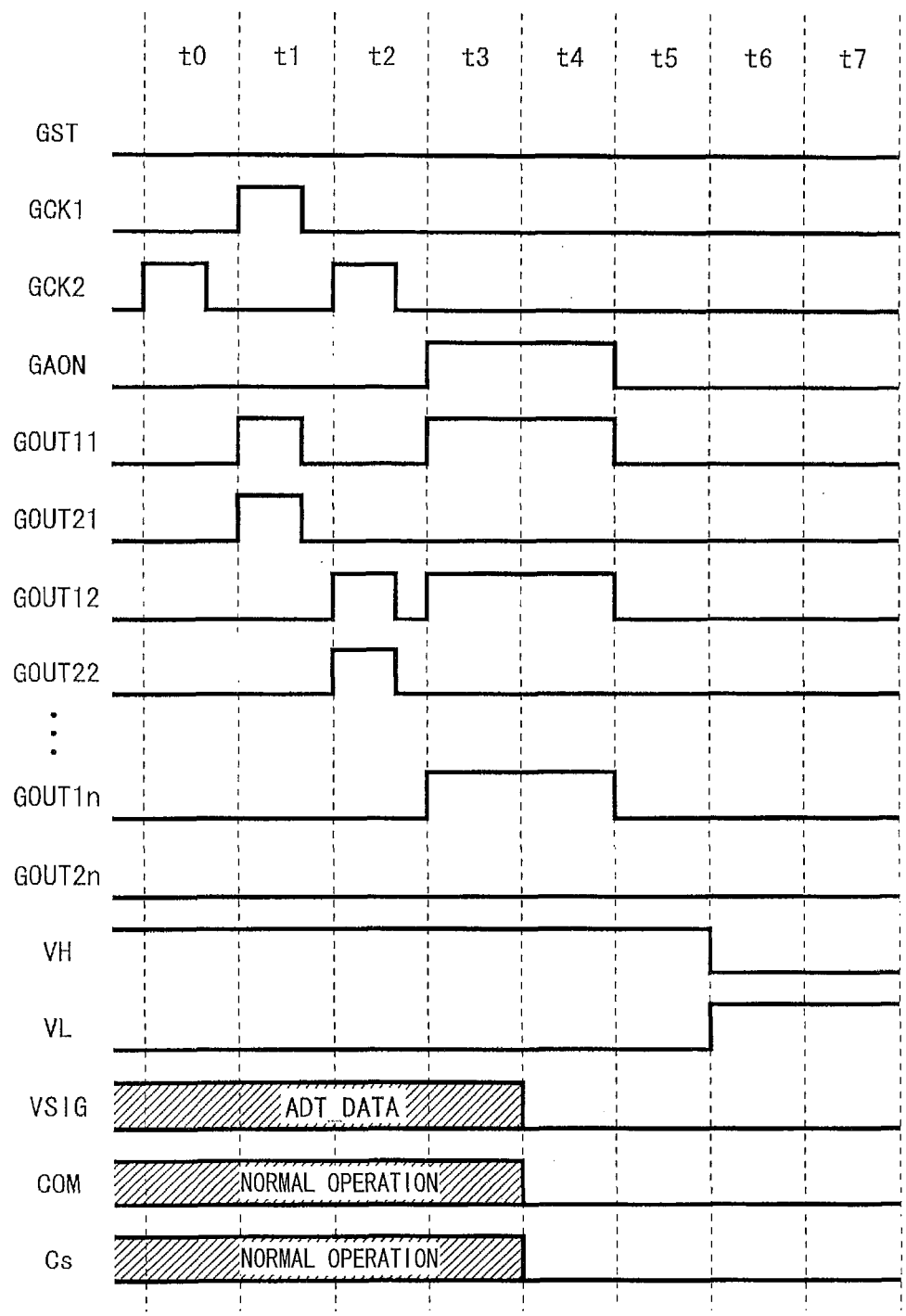
FIG. 33 is a timing chart of a case where a power supply circuit of the liquid crystal display device shown in FIG. 31 is turned off.

FIG. 33 is a timing chart of a case where the power supply circuit 136 of the liquid crystal display device 130 is turned off. As shown in FIG. 33, the all-on control signal GAON is at a low level (nonactive) during the first half, i.e. during the periods t0 to t2. Accordingly, the scanning signal line driving circuit 133 carries out normal operation, and supplies the high-level scanning signals GOUT11 to GOUTn1 to the scanning signal lines G1 to Gn, respectively, sequentially one by one at a time. Similarly, the data signal line driving circuit 134 supplies the high-level output signals to the sampling switches SW1 to SWn, respectively, sequentially one by one at a time, to sequentially turn ON the sampling switches SW1 to SWn. As a result, the analog video data ADT is sequentially written into the data signal lines S1 to Sn, so that a picture is displayed on the display section 131.

When an instruction to turn off the power supply circuit 136 of the liquid crystal display device 130 is given at the beginning of the period t3, a high-level (active) all-on control signal GAON is supplied to the scanning signal line driving circuit 133. Accordingly, the scanning signal line driving circuit 133 starts to carry out all-on operation, and simultaneously supplies the high-level output signals GOUT11 to GOUTn1 to the scanning signal lines G1 to Gn, respectively. Further, since all of the sampling switches SW1 to SWn are in an OFF state, the display elements Pij connected to the same data signal line is electrically connected to each other. Consequently, in a case where the liquid crystal display device 130 is driven by dot-inversion driving or by scanning signal line inversion driving, positive charges and negative charges stored in the display elements Pij adjacent to or near each other and connected to the same data signal line negate each other. Moreover, when the potential COM of the counter electrode Ec shifts to a state in which no voltage is applied, a shift is made to a display state in which all of the display elements Pij are substantially uniform with each other. Furthermore, the video signal line VSIG, the potential COM of the counter electrode Ec and the potential Cs of the storage electrode Es are brought to a low level by the end of the period t3, so that the charges stored in the display elements Pij are released to the video signal line VSIG. After that, the all-on operation is terminated at the end of the period t4, and furthermore the power supply circuit is turned OFF at the end of the period t5. In such a manner, it is possible to suppress a disturbance in a picture that is displayed on the display section 131 when the power supply circuit 136 has been turned off. It should be noted that this operation is applicable to a liquid crystal display device that carries out dot-inversion driving or scanning signal line inversion driving.

Further, at the beginning of the period t3, not just the scanning signal lines G1 to Gn are simultaneously raised to a high level but also the data signal lines S1 to Sn can be simultaneously raised to a high level, by further raising the all-on control signals SAON to a high level in addition to simultaneously raising the scanning signal lines G1 to Gn to a high level. In this case, it is possible to discharge electricity so that all of the display elements Pij on the display section 131 are in a uniform charge state. This makes it possible to suppress a disturbance in a picture that is displayed on the display section 131 when the power supply circuit 136 of the liquid crystal display device 130 has been turned off. It should be noted that this operation is applicable to a liquid crystal display device that carries out not only dot-inversion driving or scanning signal line inversion driving but also AC driving such as data signal line inversion driving.

<How a Liquid Crystal Display Device Operates when the Power Supply Circuit has been Forcibly Turned Off>

Figure 34:
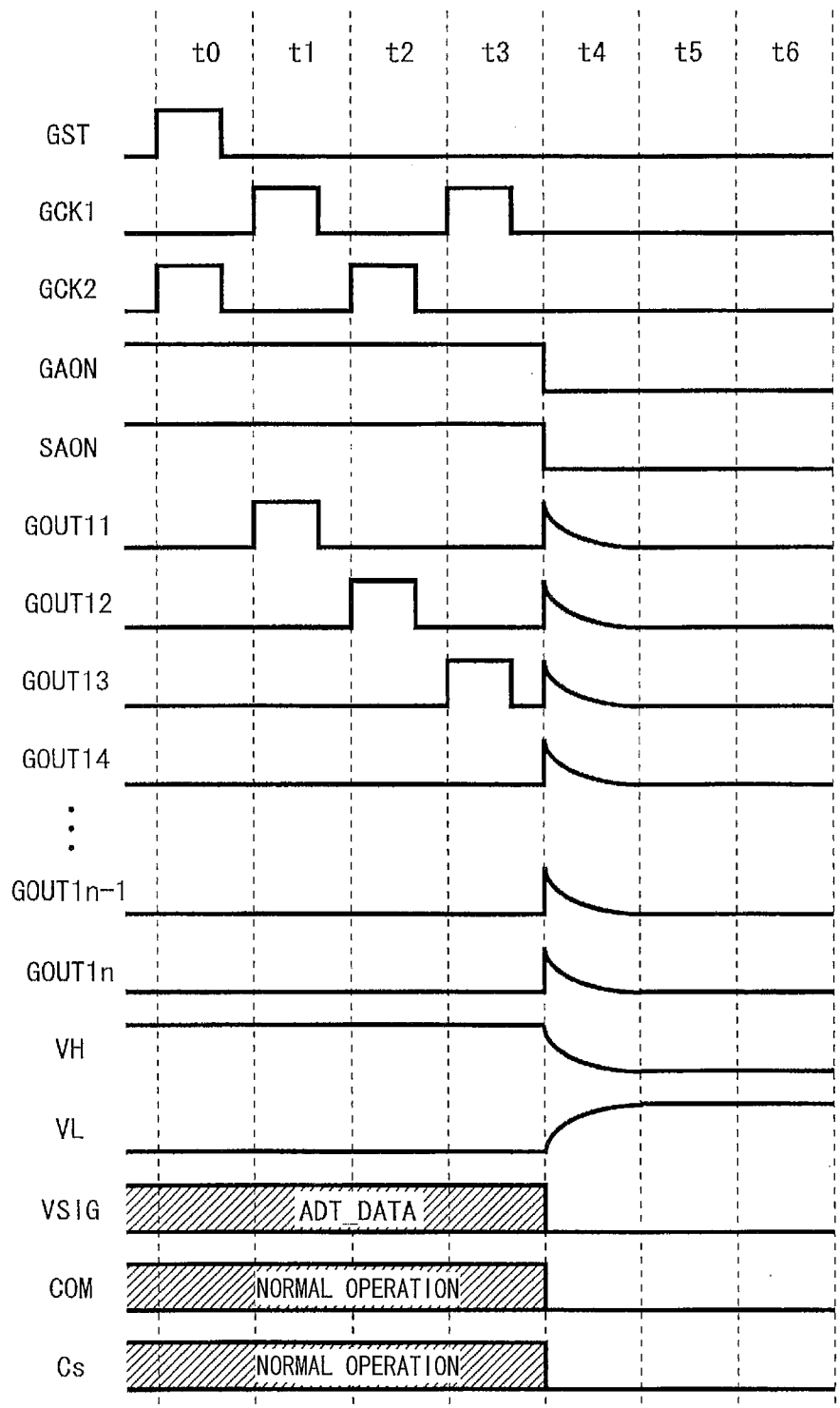
FIG. 34 is a timing chart of a case where the power supply circuit of the liquid crystal display device shown in FIG. 31 has been forcibly turned off during normal operation.
Figure 35:
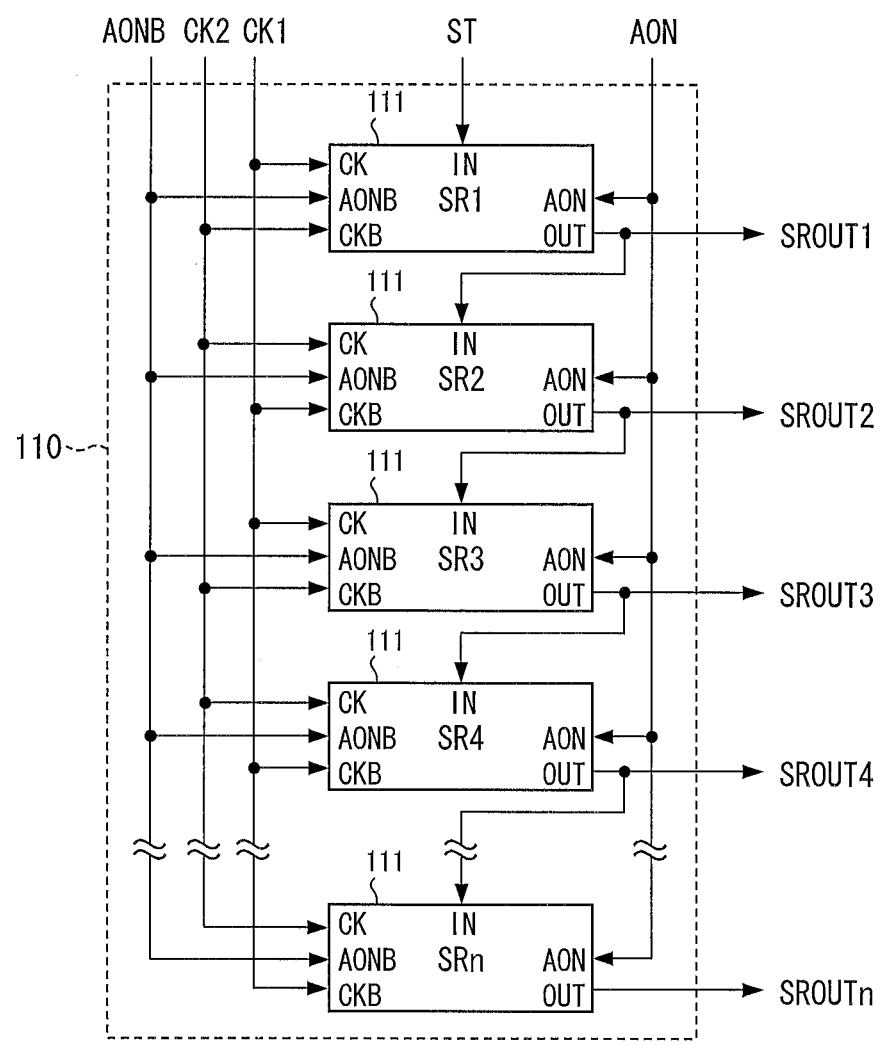
FIG. 35 is a timing chart of all-on operation of a conventional shift register.

The following description discusses a case where the power supply circuit 136 of the liquid crystal display device 130 has been forcibly turned off (turned off without a viewer's intention) while the display section 131 of the liquid crystal display device 130 is displaying a picture. FIG. 34 is a timing chart of a case where the power supply circuit 136 of the liquid crystal display device 130 carrying out normal operation has been forcibly turned off. In this case, the capacitive element 137 has one end connected to the output terminal of the power supply circuit 136 and the other end grounded.

As shown in FIG. 34, during the periods t0 to t3, the scanning signal line driving circuit 133 carries out normal operation. At this point in time, the all-on control signals GAON and SAON are both at a high level (nonactive).

If the power supply circuit 136 is forcibly turned off at the beginning of the period t4, the all-on control signals GAON and SAON are simultaneously brought to a low level (active). As a result, the scanning signal line driving circuit 133 starts to carry out all-on operation, and outputs the high-level output signals GOUT11 to GOUT1n to the scanning signal lines. Similarly, the data signal line driving circuit 134 also starts to carry out all-on operation, and outputs the high-level output signals (not illustrated) to the data signal lines 51 to Sn.

However, because of the capacitive element 137 being connected to the output terminal of the power supply circuit 136, the power supply voltages VH and VL cannot be brought to a low level in an instant. Accordingly, the power supply voltages VH and VL decrease in accordance with a time constant determined by the capacitive element 137, and are brought to a low level at the end of the period t4. As a result, the output signals GOUT11 to GOUT1n of the scanning signal line driving circuit 133 and the output signals of the data signal line driving circuit 134 are also brought to a low level at the end of the period t4, as with the power supply voltage VH. In this case, too, the same effect is brought about as with the previous case where the power supply circuit 136 has been turned off.

As described above, a shift register of the present invention is a shift register including unit circuits connected in a multistage manner, the shift register operating in accordance with a plurality of clock signals, the unit circuits being each constituted by transistors of a same conductivity type, each of the unit circuits including: a first output control transistor having one conducting terminal to be supplied with a first clock signal and the other conducting terminal connected to an output terminal; an all-on output signal generation circuit which, when an active all-on control signal is supplied to the unit circuit, outputs an ON voltage output signal to the output terminal, and which, when a nonactive all-on control signal is supplied to the unit circuit, stops outputting the ON voltage output signal; a precharge circuit which, when the nonactive all-on control signal is supplied to the unit circuit, supplies an ON voltage to a control terminal of the first output control transistor in accordance with an input signal; and a discharge circuit which, when the active all-on control signal is supplied to the unit circuit, supplies an OFF voltage to the control terminal of the first output control transistor.

According to the foregoing configuration, when the active all-on control signal is supplied to the unit circuit (all-on operation), an OFF voltage is supplied to the first output control transistor via the control terminal of the first output control transistor. Therefore, when the shift register returns to normal operation after all-on operation, i.e., when the all-on control signal is nonactive and the input signal is at a low level, the potential at the point of connection (node N1) between the precharge circuit and the first output control transistor is VSS, so that the first output control transistor is not in an ON state.

Therefore, there is no fear that when the shift register returns to normal operation after all-on operation, the transistor T2 (transistor 102 of FIG. 36) is brought into an ON state, so that the clock signal CK is outputted, as has conventionally been the case. This makes it possible to prevent the shift register from malfunctioning. Further, the unit circuit is no more complex in circuitry than a conventional unit circuit (see FIG. 36).

The shift register may be configured such that the precharge circuit includes a precharge transistor having a control terminal to be supplied with the input signal, one conducting terminal to be supplied with the ON voltage, and the other conducting terminal connected to the control terminal of the first output control transistor.

The shift register may be configured such that the precharge circuit includes (i) a first precharge transistor having a control terminal to be supplied with the nonactive all-on control signal and one conducting terminal to be supplied with the ON voltage and (ii) a second precharge transistor having a control terminal to be supplied with the input signal, one conducting terminal connected to the other conducting terminal of the first precharge transistor, and the other conducting terminal connected to the control terminal of the first output control transistor.

The shift register may be configured to further include a first reset transistor having a control terminal to be supplied with a second clock signal that is out of phase with the first clock signal and one conducting terminal to be supplied with the ON voltage, wherein the discharge circuit includes a discharge transistor having a control terminal connected to the other conducting terminal of the first reset transistor, one conducting terminal connected to the control terminal of the first output control transistor, and the other conducting terminal supplied with the OFF voltage.

The shift register may be configured to further include a second reset transistor having a control terminal to be supplied with the active all-on control signal and one conducting terminal to be supplied with the ON voltage, wherein the discharge circuit includes a discharge transistor having a control terminal connected to the other conducting terminal of the second reset transistor, one conducting terminal connected to the control terminal of the first output control transistor, and the other conducting terminal to be supplied with the OFF voltage.

The shift register may be configured to further include a third reset transistor having a control terminal to be supplied with an output signal from a subsequent unit circuit and one conducting terminal to be supplied with the ON voltage, wherein the discharge circuit includes a first discharge transistor having a control terminal connected to the other conducting terminal of the third reset transistor, one conducting terminal connected to the control terminal of the first output control transistor, and the other conducting terminal to be supplied with the OFF voltage.

The shift register may be configured to further include: a second output control transistor having one conducting terminal connected to the output terminal and the other conducting terminal to be supplied with the OFF voltage; and a reset signal generation circuit which supplies the ON voltage or the OFF voltage to the discharge circuit and to the second output control transistor, wherein: in a case where the all-on control signal to be supplied to the unit circuit is active, the reset signal generation circuit supplies the ON voltage to the discharge circuit in accordance with a second clock signal that is out of phase with the first clock signal, and supplies the OFF voltage to a control terminal of the second output control transistor during a period of time in which the input signal is the ON voltage; and in a case where the all-on control signal to be supplied to the unit circuit is nonactive, the reset signal generation circuit supplies the ON voltage to the discharge circuit and to the control terminal of the second output control transistor in accordance with the second clock signal during a period of time in which the input signal is the OFF voltage.

The shift register may be configured such that in a case where the all-on control signal to be supplied to the unit circuit is nonactive, the reset signal generation circuit further supplies the OFF voltage to the discharge circuit and to the control terminal of the second output control transistor during the period of time in which the input signal is the ON voltage.

The shift register may be configured such that: the discharge circuit includes a discharge transistor having one conducting terminal connected to the control terminal of the first output control transistor and the other conducting terminal to be supplied with the OFF voltage; and the reset signal generation circuit includes (i) a first reset transistor having a control terminal to be supplied with the second clock signal and one conducting terminal to be supplied with the ON voltage, (ii) a reset separation circuit having a control terminal to be supplied with the nonactive all-on control signal, one conducting terminal connected to the other conducting terminal of the first reset transistor and to a control terminal of the discharge transistor, and the other conducting terminal connected to the second output control transistor, and (iii) a second reset transistor having a control terminal to be supplied with the input signal, one conducting terminal connected to the other conducting terminal of the reset separation transistor and to the control terminal of the second output control transistor, and the other conducting terminal to be supplied with the OFF voltage.

The shift register may be configured such that: the discharge circuit includes a discharge transistor having one conducting terminal connected to the control terminal of the first output control transistor and the other conducting terminal to be supplied with the OFF voltage; and the reset signal generation circuit includes (i) a first reset transistor having a control terminal to be supplied with the second clock signal and one conducting terminal to be supplied with the ON voltage, (ii) a resistor element having one terminal connected to the other conducting terminal of the first reset transistor and the other conducting terminal connected to a control terminal of the discharge transistor, (iii) a reset separation transistor having a control terminal to be supplied with the nonactive all-on control signal, one conducting terminal connected to the other conducting terminal of the resistor element and to the control terminal of the discharge transistor, and the other conducting terminal connected to the second output control transistor, and (iv) a second reset transistor having a control terminal to be supplied with the input signal, one conducting terminal connected to the other conducting terminal of the reset separation transistor and to the control terminal of the second output control transistor, and the other conducing terminal to be supplied with the OFF voltage.

The shift register may be configured to further include a reset signal generation circuit which, in a case where the all-on control signal to be supplied to the unit circuit is active, supplies the OFF voltage to the discharge circuit during a period of time in which the input signal is the ON voltage, and which, in a case where the all-on control signal to be supplied to the unit circuit is nonactive, supplies the ON voltage to the discharge circuit in accordance with a second clock signal during a period of which the input signal is the OFF voltage, the second clock signal being out of phase with the first clock signal.

The shift register may be configured to further include: a second output control transistor having one conducting terminal connected to the output terminal and the other conducting terminal to be supplied with the OFF voltage; and a reset signal generation circuit which supplies the ON voltage or the OFF voltage to the discharge circuit and to the second output control transistor, wherein: in a case where the all-on control signal to be supplied to the unit circuit is active, the reset signal generation circuit supplies the OFF voltage to the discharge circuit and to the control terminal of the second output control transistor during a period of time in which the input signal is the ON voltage; and in a case where the all-on control signal to be supplied to the unit circuit is nonactive, the reset signal generation circuit supplies the ON voltage to the discharge circuit and to the control terminal of the second output control transistor in accordance with a second clock signal during a period of time in which the input signal is the OFF voltage, the second clock signal being out of phase with the first clock signal.

The shift register may be configured such that in a case where the all-on control signal to be supplied to the unit circuit is nonactive, the reset signal generation circuit further supplies the OFF voltage to the discharge circuit and to the control terminal of the second output control transistor during the period of time in which the input signal is the ON voltage.

The shift register may be configured such that the unit circuit further includes an output reset transistor having a control terminal to be supplied with the active all-on control signal, one conducting terminal connected to the control terminal of the second output control transistor, and the other conducting terminal to be supplied with the OFF voltage.

The shift register may be configured such that the unit circuit further includes a second discharge transistor having a control terminal to be supplied with the active all-on control signal, one conducting terminal connected to the control terminal of the first output control transistor, and the other conducting terminal to be supplied with the OFF voltage.

The shift register may be configured such that a capacitor is provided between the control terminal of the first output control transistor and the other conducting terminal of the first output control transistor.

A display device of the present invention is a display device including a display panel including data signal lines and scanning signal lines, the display device including: a scanning signal line driving circuit which includes a shift register as set forth in any one of the above and which sequentially selects the scanning signal lines; a data signal line driving circuit which supplies a video signal to the data signal lines; and a power supply circuit which supplies a power supply voltage to the scanning signal line driving circuit and the data signal line driving circuit, when the power supply circuit has been turned on or off, all of the scanning signal lines being made active by supplying the active all-on control signal to the scanning signal line driving circuit.

The display device may be configured such that: the data signal line driving circuit includes a shift register as set forth in any one of the above; and when the power supply circuit has been turned on or off, all of the data signal lines being supplied with a same voltage by supplying the active all-on control signal to the data signal line driving circuit.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applied to a shift register constituted by transistors of the same conductivity type that operates in accordance with clock signals, and is especially suitable for a driving circuit or the like of a display device or of an imaging device.

REFERENCE SIGNS LIST

10, 20, 30, 40, 50, 60, 70, 80, 90, 100 Shift register
11, 21, 31, 41, 51, 61, 71, 81, 91, 101 Unit circuit 32 Delay circuit
T1 Transistor (precharge circuit, precharge transistor, second precharge transistor)
T2 Transistor (output control transistor, first output control transistor)
T3 Transistor (output control transistor, second output control transistor)
T4 Transistor (discharge circuit, discharge transistor, first discharge transistor)
T5 Transistor (reset transistor, first reset transistor)
T6 Transistor (reset separation transistor)
T7 Transistor (resent transistor, second reset transistor)
T8 Transistor (precharge transistor, first precharge transistor)
T9 Transistor (all-on output signal generation circuit)
T10 Transistor (reset transistor, second reset transistor)
T11 Transistor (reset transistor, third reset transistor)
T12 Transistor (discharge transistor, second discharge transistor)
T13 Transistor (output reset transistor)
R1 Resistor (resistor element)
C1, C2 Capacitor
110, 120, 130 Liquid crystal display device (display device)

The invention claimed is:

1. A shift register including unit circuits connected in a multistage manner, the shift register operating in accordance with a plurality of clock signals, the unit circuits including transistors of a same conductivity type, each of the unit circuits comprising:
a first output control transistor including one conducting terminal to be supplied with a first clock signal and another conducting terminal connected to an output terminal;
an all-on output signal generation circuit which, when an active all-on control signal is supplied to the unit circuit, outputs an ON voltage output signal to the output terminal, and which, when a nonactive all-on control signal is supplied to the unit circuit, stops outputting the ON voltage output signal;
a precharge circuit which, when the nonactive all-on control signal is supplied to the unit circuit, supplies an ON voltage to a control terminal of the first output control transistor in accordance with an input signal;
a discharge circuit which, when the active all-on control signal is supplied to the unit circuit, supplies an OFF voltage to the control terminal of the first output control transistor;
a second output control transistor including one conducting terminal connected to the output terminal and the another conducting terminal to be supplied with the OFF voltage; and
a reset signal generation circuit which supplies the ON voltage or the OFF voltage to the discharge circuit and to the second output control transistor, wherein
in a case where the all-on control signal to be supplied to the unit circuit is active, the reset signal generation circuit supplies the ON voltage to the discharge circuit in accordance with a second clock signal that is out of phase with the first clock signal, and supplies the OFF voltage to a control terminal of the second output control transistor during a period of time in which the input signal is the ON voltage;
in a case where the all-on control signal to be supplied to the unit circuit is nonactive, the reset signal generation circuit supplies the ON voltage to the discharge circuit and to the control terminal of the second output control transistor in accordance with the second clock signal during a period of time in which the input signal is the OFF voltage;
the discharge circuit includes a discharge transistor including one conducting terminal connected to the control terminal of the first output control transistor and another conducting terminal to be supplied with the OFF voltage; and
the reset signal generation circuit includes (i) a first reset transistor including a control terminal to be supplied with the second clock signal and one conducting terminal to be supplied with the ON voltage, (ii) a resistor element including one terminal connected to the another conducting terminal of the first reset transistor and another terminal connected to a control terminal of the discharge transistor, (iii) a reset separation transistor including a control terminal to be supplied with the nonactive all-on control signal, one conducting terminal connected to the another terminal of the resistor element and to the control terminal of the discharge transistor, and another conducting terminal connected to the second output control transistor, and (iv) a second reset transistor including a control terminal to be supplied with the input signal, one conducting terminal connected to the another conducting terminal of the reset separation transistor and to the control terminal of the second output control transistor, and another conducting terminal to be supplied with the OFF voltage.

2. The shift register as set forth in claim 1, wherein the precharge circuit includes a precharge transistor having a control terminal to be supplied with the input signal, one conducting terminal to be supplied with the ON voltage, and the other conducting terminal connected to the control terminal of the first output control transistor.

3. The shift register as set forth in claim 1, wherein the precharge circuit includes (i) a first precharge transistor having a control terminal to be supplied with the nonactive all-on control signal and one conducting terminal to be supplied with the ON voltage and (ii) a second precharge transistor having a control terminal to be supplied with the input signal, one conducting terminal connected to the other conducting terminal of the first precharge transistor, and the other conducting terminal connected to the control terminal of the first output control transistor.

4. The shift register as set forth in claim 1, further comprising a first reset transistor having a control terminal to be supplied with a second clock signal that is out of phase with the first clock signal and one conducting terminal to be supplied with the ON voltage, wherein
the discharge circuit includes a discharge transistor having a control terminal connected to the other conducting terminal of the first reset transistor, one conducting terminal connected to the control terminal of the first output control transistor, and the other conducting terminal supplied with the OFF voltage.

5. The shift register as set forth in claim 1, further comprising a second reset transistor having a control terminal to be supplied with the active all-on control signal and one conducting terminal to be supplied with the ON voltage, wherein
the discharge circuit includes a discharge transistor having a control terminal connected to the other conducting terminal of the second reset transistor, one conducting terminal connected to the control terminal of the first output control transistor, and the other conducting terminal to be supplied with the OFF voltage.

6. The shift register as set forth in claim 1, further comprising a third reset transistor having a control terminal to be supplied with an output signal from a subsequent unit circuit and one conducting terminal to be supplied with the ON voltage, wherein the discharge circuit includes a first discharge transistor having a control terminal connected to the other conducting terminal of the third reset transistor, one conducting terminal connected to the control terminal of the first output control transistor, and the other conducting terminal to be supplied with the OFF voltage.

7. The shift register as set forth in claim 1, wherein in a case where the all-on control signal to be supplied to the unit circuit is nonactive, the reset signal generation circuit further supplies the OFF voltage to the discharge circuit and to the control terminal of the second output control transistor during the period of time in which the input signal is the ON voltage.

8. The shift register as set forth in claim 1, further comprising a reset signal generation circuit which, in a case where the all-on control signal to be supplied to the unit circuit is active, supplies the OFF voltage to the discharge circuit during a period of time in which the input signal is the ON voltage, and which, in a case where the all-on control signal to be supplied to the unit circuit is nonactive, supplies the ON voltage to the discharge circuit in accordance with a second clock signal during a period of which the input signal is the OFF voltage, the second clock signal being out of phase with the first clock signal.

9. The shift register as set forth in claim 1, further comprising:

a second output control transistor having one conducting terminal connected to the output terminal and the other conducting terminal to be supplied with the OFF voltage; and a reset signal generation circuit which supplies the ON voltage or the OFF voltage to the discharge circuit and to the second output control transistor, wherein:

in a case where the all-on control signal to be supplied to the unit circuit is active, the reset signal generation circuit supplies the OFF voltage to the discharge circuit and to the control terminal of the second output control transistor during a period of time in which the input signal is the ON voltage; and in a case where the all-on control signal to be supplied to the unit circuit is nonactive, the reset signal generation circuit supplies the ON voltage to the discharge circuit and to the control terminal of the second output control transistor in accordance with a second clock signal during a period of time in which the input signal is the OFF voltage, the second clock signal being out of phase with the first clock signal.

10. The shift register as set forth in claim 9, wherein in a case where the all-on control signal to be supplied to the unit circuit is nonactive, the reset signal generation circuit further supplies the OFF voltage to the discharge circuit and to the control terminal of the second output control transistor during the period of time in which the input signal is the ON voltage.

11. The shift register as set forth in claim 1, wherein the unit circuit further includes an output reset transistor having a control terminal to be supplied with the active all-on control signal, one conducting terminal connected to the control terminal of the second output control transistor, and the other conducting terminal to be supplied with the OFF voltage.

12. The shift register as set forth in claim 1, wherein the unit circuit further includes a second discharge transistor having a control terminal to be supplied with the active all-on control signal, one conducting terminal connected to the control terminal of the first output control transistor, and the other conducting terminal to be supplied with the OFF voltage.

13. The shift register as set forth in claim 1, wherein a capacitor is provided between the control terminal of the first output control transistor and the other conducting terminal of the first output control transistor.

14. A display device including a display panel including data signal lines and scanning signal lines, the display device comprising:

a scanning signal line driving circuit which includes a shift register as set forth in claim 1 and which sequentially selects the scanning signal lines;

a data signal line driving circuit which supplies a video signal to the data signal lines; and a power supply circuit which supplies a power supply voltage to the scanning signal line driving circuit and the data signal line driving circuit, when the power supply circuit has been turned on or off, all of the scanning signal lines being made active by supplying the active all-on control signal to the scanning signal line driving circuit.

15. The display device as set forth in claim 14, wherein:

the data signal line driving circuit includes the shift register; and when the power supply circuit has been turned on or off, all of the data signal lines being supplied with a same voltage by supplying the active all-on control signal to the data signal line driving circuit.

* * * * *